(12) United States Patent
Sanduleanu et al.

(10) Patent No.: US 8,344,795 B2
(45) Date of Patent: Jan. 1, 2013

(54) SELF-CALIBRATED, BROADBAND, TUNABLE, ACTIVE FILTER WITH UNITY GAIN CELLS FOR MULTI-STANDARD AND/OR MULTIBAND CHANNEL SELECTION

(75) Inventors: Mihai Sanduleanu, Yorktown Heights, NY (US); Ping-Yu Chen, Hsinchu (TW)

(73) Assignee: International Business Machines Corporation, Armonk, NY (US)

( * ) Notice: Subject to any disclaimer, the term of this patent is extended or adjusted under 35 U.S.C. 154(b) by 100 days.

(21) Appl. No.: 13/010,249

(22) Filed: Jan. 20, 2011

(65) Prior Publication Data
US 2012/0188006 A1 Jul. 26, 2012

(51) Int. Cl.
*H03K 5/00* (2006.01)
(52) U.S. Cl. .......................... 327/554; 327/552
(58) Field of Classification Search .......... 327/551–559, 327/336–337
See application file for complete search history.

(56) References Cited

U.S. PATENT DOCUMENTS

| | | | |
|---|---|---|---|
| 3,946,328 A | 3/1976 | Boctor | |
| 4,095,218 A | 6/1978 | Crouse | |
| 4,862,121 A * | 8/1989 | Hochschild et al. | 333/173 |
| 4,952,891 A | 8/1990 | Moulding | |
| 5,036,219 A | 7/1991 | Dingwall et al. | |
| 5,298,801 A | 3/1994 | Vorenkamp et al. | |
| 5,389,929 A | 2/1995 | Nayebi et al. | |
| 5,495,200 A * | 2/1996 | Kwan et al. | 327/553 |
| 5,517,141 A | 5/1996 | Abdi et al. | |
| 5,673,047 A | 9/1997 | Moreland | |
| 5,736,878 A | 4/1998 | McLeod | |
| 6,011,431 A | 1/2000 | Gilbert | |
| 6,037,891 A | 3/2000 | Griph | |
| 6,094,093 A | 7/2000 | Karanicolas | |

(Continued)

FOREIGN PATENT DOCUMENTS

| | | |
|---|---|---|
| WO | 2004066487 A2 | 8/2004 |
| WO | 2005013284 A1 | 2/2005 |
| WO | 2009034518 A2 | 3/2009 |

OTHER PUBLICATIONS

K.Y. Leung et al., "A Dual Low Power ½ LSB INL 16b/1 Msample/s SAR A/D Converter with On-Chip Microcontroller," IEEE Asian Solid-State Circuits Conference, Nov. 2006, pp. 51-54.

(Continued)

*Primary Examiner* — Dinh T. Le
(74) *Attorney, Agent, or Firm* — Anne V. Dougherty; Ryan, Mason & Lewis, LLP

(57) ABSTRACT

An exemplary filter includes N ($\geq 2$) unity gain amplifiers, each with a pair of differential input terminals and a pair of differential output terminals; a pair of filter differential input terminals; a first pair of variable resistances coupling the pair of filter differential input terminals to the pair of differential input terminals of the first unity gain amplifier; N–1 pairs of variable resistances coupling the pairs of differential output terminals of each of the N unity gain amplifiers, other than the last one, to the pairs of differential input terminals of its downstream neighbor; N–1 pairs of variable capacitances coupling the pairs of differential input terminals of each of the N unity gain amplifiers, other than the last one, to the pairs of differential output terminals of its downstream neighbor; and a variable capacitance coupling the pair of differential input terminals of the last unity gain amplifier to each other.

13 Claims, 23 Drawing Sheets

U.S. PATENT DOCUMENTS

| | | | |
|---|---|---|---|
| 6,307,443 | B1 | 10/2001 | Gabara |
| 6,373,332 | B2 * | 4/2002 | Kawai ........................ 327/556 |
| 6,480,133 | B2 | 11/2002 | Kobayashi et al. |
| 6,657,488 | B1 | 12/2003 | King et al. |
| 6,731,155 | B2 | 5/2004 | Hakkarainen et al. |
| 6,778,023 | B2 | 8/2004 | Christensen |
| 6,798,726 | B2 | 9/2004 | Redman-White et al. |
| 6,803,813 | B1 | 10/2004 | Pham |
| 6,831,584 | B2 | 12/2004 | Jiang et al. |
| 6,930,565 | B1 | 8/2005 | Vishinsky |
| 7,075,364 | B2 * | 7/2006 | Gudem et al. ................ 327/552 |
| 7,136,000 | B1 | 11/2006 | Hidri et al. |
| 7,148,828 | B2 | 12/2006 | Fernandez et al. |
| 7,154,306 | B2 | 12/2006 | Wuppermann |
| 7,400,212 | B1 | 7/2008 | Vishinsky |
| 7,425,863 | B2 * | 9/2008 | Gatta et al. .................... 327/558 |
| 7,492,242 | B2 | 2/2009 | Carpenter |
| 7,528,752 | B1 | 5/2009 | Chern |
| 7,545,235 | B2 | 6/2009 | Mansour et al. |
| 2006/0001455 | A1 | 1/2006 | Wuppermann |
| 2006/0049857 | A1 | 3/2006 | Song |
| 2006/0125531 | A1 | 6/2006 | Romero et al. |
| 2006/0152251 | A1 | 7/2006 | Setterberg |
| 2006/0192546 | A1 | 8/2006 | Geelen |
| 2007/0008030 | A1 | 1/2007 | Kasperkovitz |
| 2007/0152863 | A1 | 7/2007 | Le et al. |
| 2008/0150772 | A1 | 6/2008 | Cao et al. |
| 2009/0015329 | A1 | 1/2009 | Chatterjee et al. |
| 2009/0039923 | A1 | 2/2009 | Corsi et al. |
| 2009/0066555 | A1 | 3/2009 | Van Der Plas et al. |
| 2009/0072868 | A1 | 3/2009 | Choi et al. |
| 2009/0278625 | A1 | 11/2009 | Chen et al. |
| 2010/0022215 | A1 | 1/2010 | Ganger et al. |

OTHER PUBLICATIONS

M.P. Flynn et al., "Digital Calibration Incorporating Redundancy of Flash ADCs," IEEE Transactions on Circuits and Systems—II: Analog and Digital Signal Processing, May 2003, pp. 205-213, vol. 50, No. 5.

M. Wang et al., "Low-Power 4-b 2.5-GSPS Pipelined Flash Analog-to-Digital Converter in 130-nm CMOS," IEEE Transactions on Instrumentation and Measurement, Jun. 2007, pp. 1064-1073, vol. 56, No. 3.

Andrew N. Karanicolas, "A 2.7-V 300-MS/s Track-and-Hold Amplifier," IEEE Journal of Solid-State Circuits, Dec. 1997, pp. 1961-1967, vol. 32, No. 12.

S. Shahramian et al., "A 40-G samples/sec Track & Hold Amplifier in 0.18 μm SiGe BiCMOS Technology," IEEE Compound Semiconductor Integrated Circuit Symposium, Oct.-Nov. 2005, pp. 101-104.

A.M. Abo et al., "A 1.5-V, 10-Bit, 14.3-MS/s CMOS Pipeline Analog-to-Digital Converter," IEEE Journal of Solid-State Circuits, May 1999, pp. 599-606, vol. 34, No. 5.

J. Steensgaard, "Bootstrapped Low-Voltage Analog Switches," IEEE International Symposium on Circuits and Systems, Jul. 1999, pp. 29-32, vol. 2.

H. Pan et al., "A 3.3-V 12-b 50-MS/s A/D Converter in 0.6-μm CMOS with Over 80-dB SFDR," IEEE Journal of Solid-State Circuits, Dec. 2000, pp. 1769-1780, vol. 35, No. 12.

M. Dessouky et al., "Very Low-Voltage Digital-Audio ΔΣ Modulator with 88-dB Dynamic Range Using Local Switch Bootstrapping," Mar. 2001, pp. 349-355, vol. 36, No. 3.

Ron Tipton, "All About Electronically-Tunable Active Filters," Poptronics, Aug. 2000, pp. 42-50.

A. Papoulis, "Optimum Filters with Monotonic Response," Proceedings of the IRE, Mar. 1958, pp. 606-609, vol. 46, No. 3.

A. Papoulis, "On Monotonic Response Filters," Proceedings of the IRE, Feb. 1959, pp. 332-333, vol. 47.

U.S. Appl. No. 13/010,285, filed in the name of M.A.T. Sanduleanu et al. on Jan. 20, 2011 and entitled "Track and Hold Amplifiers and Digital Calibration for Analog-to-Digital Converters."

\* cited by examiner

Columns 1 through 5
1.000000000000000 2.401255544935420 5.105236318263741 6.917117862985009 7.744715357471590
Columns 6 through 10
6.578613235900965 4.467303444041095 2.304114417958683 0.873138010932684 0.217198998094448
Column 11
0.027014861443748

BODE DIAGRAM

BODE DIAGRAM

FIG. 11

NUMERATOR COEFFICIENT 0.0127972719078180

DENOMINATOR COEFFICIENTS ($s^{10}, s^9, ..., s^1, s^0$)

Columns 1 through 7

1.0000000000000000  1.6667661706151900  3.8890547337536070  4.3653696353810430  5.0261770694182000  3.8085044254252340  2.5790346391857190

Columns 8 through 11

1.2296637729082780  0.4572160892677630  0.1070339806984580  0.0129454573325260

LINEARIZED OTA STAGE WITH N≥2

$$i1 - i2 = \sqrt{\frac{2 \cdot K \cdot I_0}{N+2}} \cdot \sqrt{1 - \frac{K \cdot V_{ID}^2}{4 \cdot I_0}} \cdot V_{ID}$$

SELF-CALIBRATED, BROADBAND, TUNABLE, ACTIVE FILTER WITH UNITY GAIN CELLS FOR MULTI-STANDARD AND/OR MULTIBAND CHANNEL SELECTION

CROSS REFERENCE TO RELATED APPLICATION

The present application is related to the U.S. patent application identified as U.S. Ser. No. 13/010,285, entitled "Track and Hold Amplifiers and Digital Calibration for Analog-to-Digital Converters," filed concurrently herewith, the disclosure of which is incorporated by reference herein in its entirety.

FIELD OF THE INVENTION

The present invention generally relates to electronic circuitry, and, more particularly, to filters.

BACKGROUND OF THE INVENTION

Filters can be employed in a variety of applications. In some instances, channel filters are appropriate for channel selectivity and anti-aliasing before analog-to-digital (A/D) conversion. For 60 GHz communication systems, channel bandwidth is on the order of 1 GHz. Future 60 GHz standards will likely use channel bonding with channel bandwidth far in excess of 1 GHz.

U.S. Patent Publication 2009/0278625 discloses a broadband filter filtering noise over a first conductive wire, a second conductive wire, and a third conductive wire, which includes a differential-mode filtering circuit connected to both the first conductive wire and the second conductive wire and a common-mode filtering circuit connected to both the first conductive wire and the second conductive wire. The differential-mode filtering circuit includes two inductors and two capacitors for filtering differential-mode noise of different frequencies. The common-mode filtering circuit includes two inductors and six capacitors filtering common-mode noise of different frequencies.

U.S. Patent Publication 2010/0022215 discloses baseband filters for use in wireless communication devices. An embodiment of a baseband filter in a transmitter subsystem of a wireless device comprises an operational amplifier (op-amp), a pole circuit, a feedback capacitor, and an active device. The op-amp is adapted to produce an amplified signal that includes noise gain produced by the op-amp. The pole circuit is electrically coupled with an output terminal of the op-amp, and is adapted to receive the amplified signal and to attenuate the noise gain to produce a filtered, amplified signal. The feedback capacitor is electrically coupled between the first pole circuit and an input terminal of the op-amp, and is adapted to compensate for a phase shift produced by the pole circuit. The active device is electrically coupled with the pole circuit, and is adapted to amplify the filtered, amplified signal and to produce a baseband filtered output signal.

U.S. Patent Publication 2007/0008030 discloses a control system for programmable filters.

SUMMARY OF THE INVENTION

Principles of the present invention provide techniques for self calibrated, broadband, tunable, active filter with unity gain cells for multi-standard and/or multiband channel selection.

In an exemplary embodiment, according to one aspect of the invention, an exemplary filter includes N unity gain amplifiers, N being at least two. Each of the N unity gain amplifiers has a pair of differential input terminals and a pair of differential output terminals. The pair of differential output terminals of the last one of the N unity gain amplifiers are the filter differential output terminals. Also included are a pair of filter differential input terminals; a first pair of variable resistances coupling the pair of filter differential input terminals to the pair of differential input terminals of a first one of the N unity gain amplifiers; N−1 pairs of variable resistances coupling the pairs of differential output terminals of each of the N unity gain amplifiers, other than the last one of the N unity gain amplifiers, to the pairs of differential input terminals of its downstream neighbor; N−1 pairs of variable capacitances coupling the pairs of differential input terminals of each of the N unity gain amplifiers, other than the last one of the N unity gain amplifiers, to the pairs of differential output terminals of its downstream neighbor; and a variable capacitance coupling the pair of differential input terminals of the last one of the N unity gain amplifiers to each other. The N unity gain amplifiers each in turn include a linearized operational transconductance amplifier stage coupled to a corresponding pair of the differential input terminals; and a unity gain buffer with feedback interconnected between the linearized operational transconductance amplifier stage and a corresponding pair of the differential output terminals.

In another exemplary embodiment, according to another aspect of the invention, an exemplary oscillator includes N greater than unity gain amplifiers, N being at least two. Each of the N greater than unity gain amplifiers has a pair of differential input terminals and a pair of differential output terminals. Also included are a first pair of variable resistances coupling a negative one of the pair of differential output terminals of a last one of the N greater than unity gain amplifiers to a positive one of the pair of differential input terminals of a first one of the N greater than unity gain amplifiers, and a positive one of the pair of differential output terminals of the last one of the N greater than unity gain amplifiers to a negative one of the pair of differential input terminals of the first one of the N greater than unity gain amplifiers. In addition, N−1 pairs of variable resistances couple the pairs of differential output terminals of each of the N greater than unity gain amplifiers, other than the last one of the N greater than unity gain amplifiers, to the pairs of differential input terminals of its downstream neighbor; and N−1 pairs of variable capacitances couple the pairs of differential input terminals of each of the N greater than unity gain amplifiers, other than the last one of the N greater than unity gain amplifiers, to the pairs of differential output terminals of its downstream neighbor. A variable capacitance couples the pair of differential input terminals of the last one of the N greater than unity gain amplifiers to each other. The N greater than unity gain amplifiers each in turn include a linearized operational transconductance amplifier stage coupled to a corresponding pair of the differential input terminals, and a unity gain buffer with feedback interconnected between the linearized operational transconductance amplifier stage and a corresponding pair of the differential output terminals.

In yet another exemplary embodiment, an exemplary circuit includes an filter and oscillator of the kind described, and a control arrangement configured to compare a frequency of oscillation of the oscillator to a reference, and exert common control over the variable resistances and capacitances of the filter and oscillator so as to match the frequency of oscillation of the oscillator to the reference and to control bandwidth of the filter.

These and other objects, features and advantages of the present invention will become apparent from the following detailed description of illustrative embodiments thereof, which is to be read in connection with the accompanying drawings.

BRIEF DESCRIPTION OF THE DRAWINGS

FIG. 5 tabulates complex conjugate poles for an exemplary Papoulis filter of order N=10;

FIG. 6 presents denominator coefficients in the transfer function for an exemplary Papoulis filter of order N=10;

FIG. 11 presents the numerator coefficient and denominator coefficients for an exemplary Chebyshev I filter of order N=10;

DETAILED DESCRIPTION OF PREFERRED EMBODIMENTS

Figure 1:
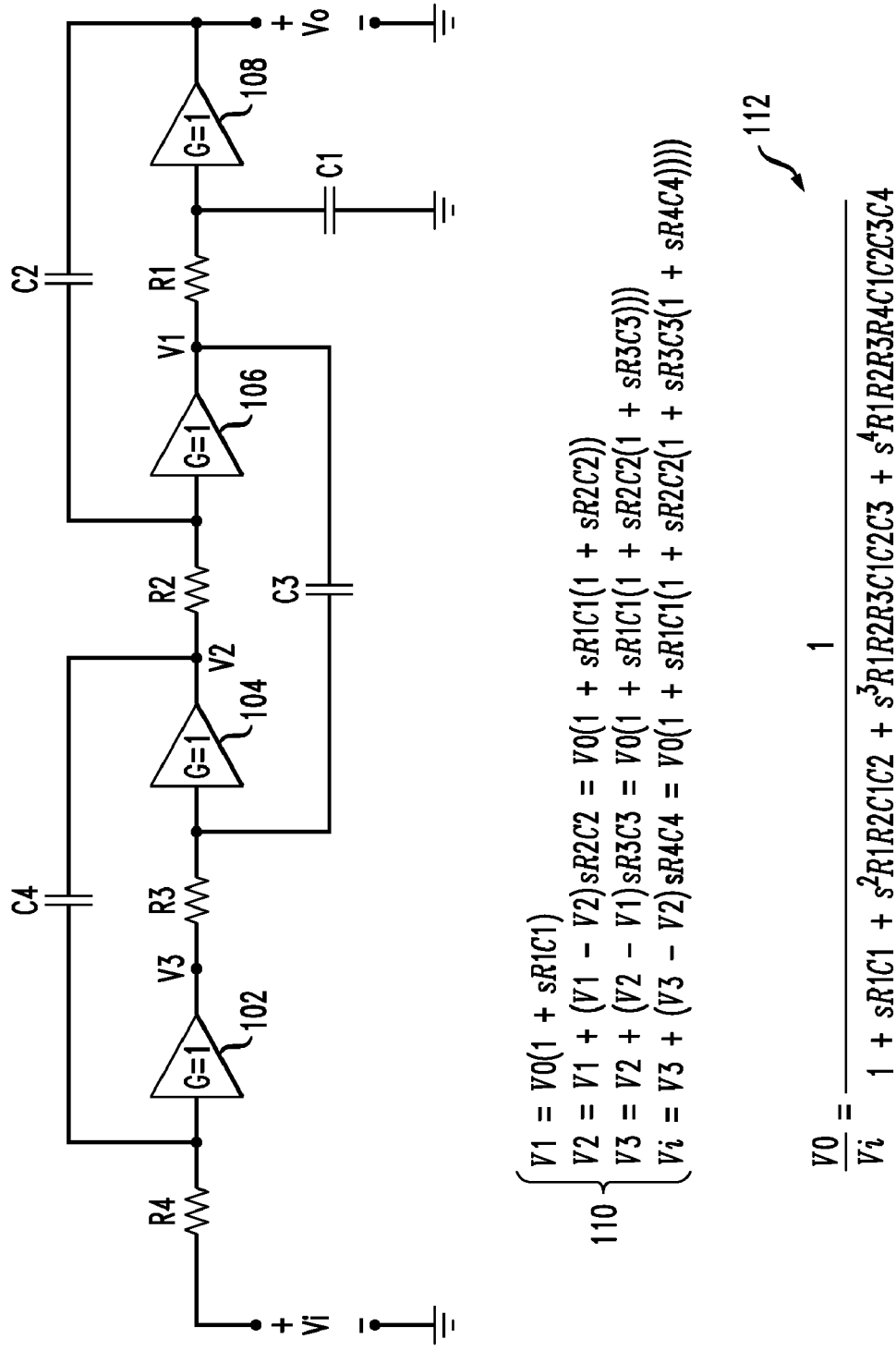
FIG. 1 shows an exemplary all-poles filter topology of order N=4.

Reference should now be had to FIG. 1. One or more embodiments employ active components to provide an active filter based on unity-gain cells. In one or more instances, unity gain buffers or amplifiers are provided at the transistor level with very high linearity and 0 dB gain. One or more embodiments construct all-pole filters with unity gain buffers. FIG. 1 is a non-limiting example of order N=4, but one or more embodiments can readily be generalized for larger numbers of poles, thus providing scalability.

Note input voltage Vi coupled to input of first unity gain amplifier 102 through resistor R4, the output of 102 which is at voltage V3 and is coupled to the input of second unity gain amplifier 104 through resistor R3; the output of 104 which is at voltage V2 and is coupled to the input of third unity gain amplifier 106 through resistor R2; the output of 106 which is at voltage V1 and is coupled to the input of fourth unity gain amplifier 108 through resistor R1; and the output of 108 which is the output voltage V0. Note also capacitor C1 between the input of 108 and ground; capacitor C2 coupling the input of 106 and output of 108; capacitor C3 coupling the input of 104 and output of 106; and capacitor C4 coupling the input of 102 and output of 104. The equations for the voltages are at 110 and the transfer function at 112. The number of resistors, capacitors, and amplifiers determines the order of the filter.

Broadband unity gain amplifiers enable a large bandwidth filter. Source followers in modern CMOS technologies have a G of less than unity. Modern filters are typically differential with common mode rejection. One or more embodiments provide a differential broadband amplifier with G of unity, as well as with high linearity suitable for orthogonal frequency-division multiplexing (OFDM) modulated signals.

Figure 2:
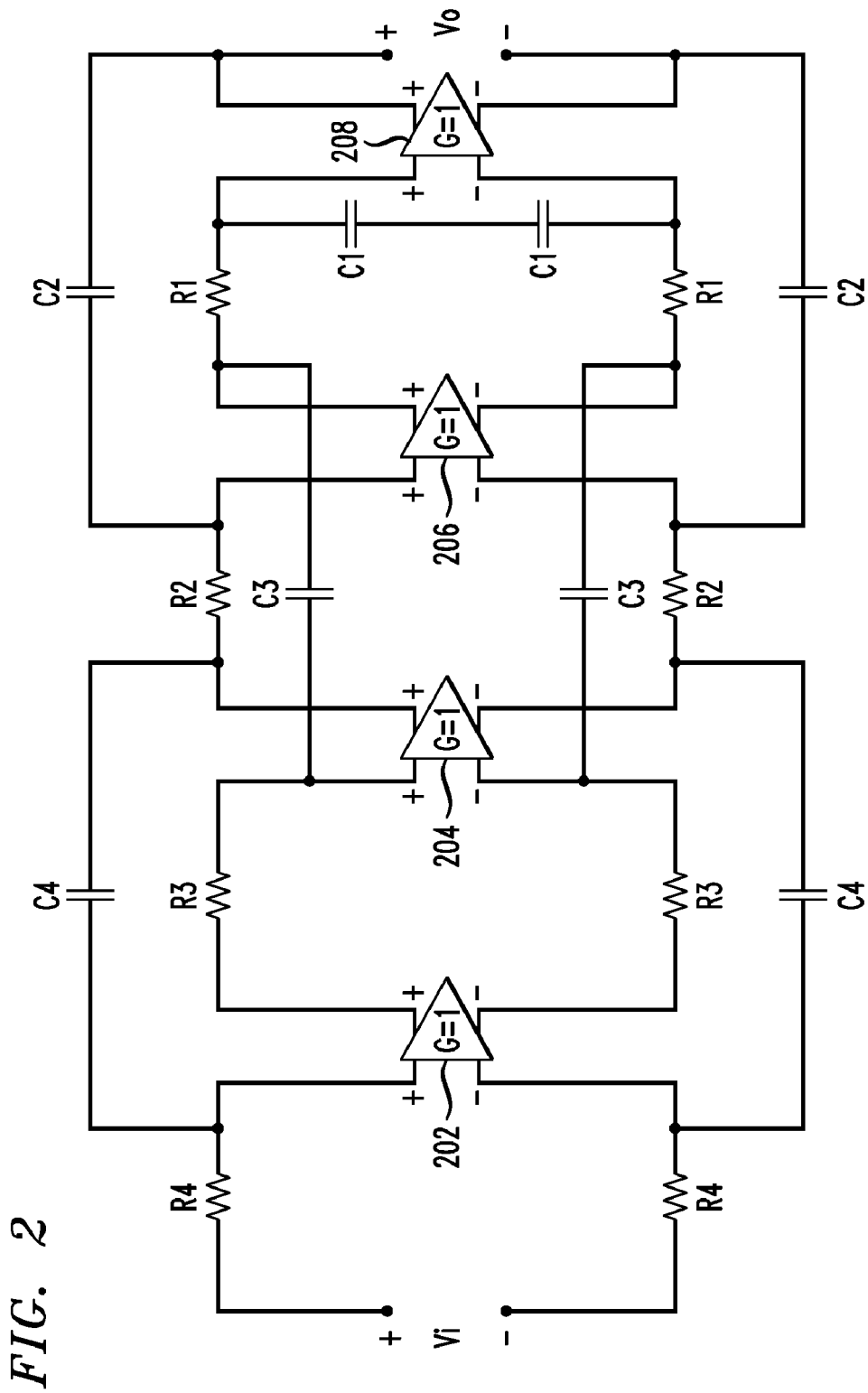
FIG. 2 shows an exemplary differential all-poles filter topology of order N=4.

FIG. 2 shows a differential all-poles filter using differential unity gain amplifiers 202, 204, 206, 208. There are two inputs associated with differential input voltage V1 and two outputs associated with differential output voltage V0. The dual inputs and outputs are interconnected in a similar manner to FIG. 1 except that the input and output are taken between the differential terminals instead of a single terminal and ground, and the capacitors C1 are interconnected instead of being grounded.

Figure 3:
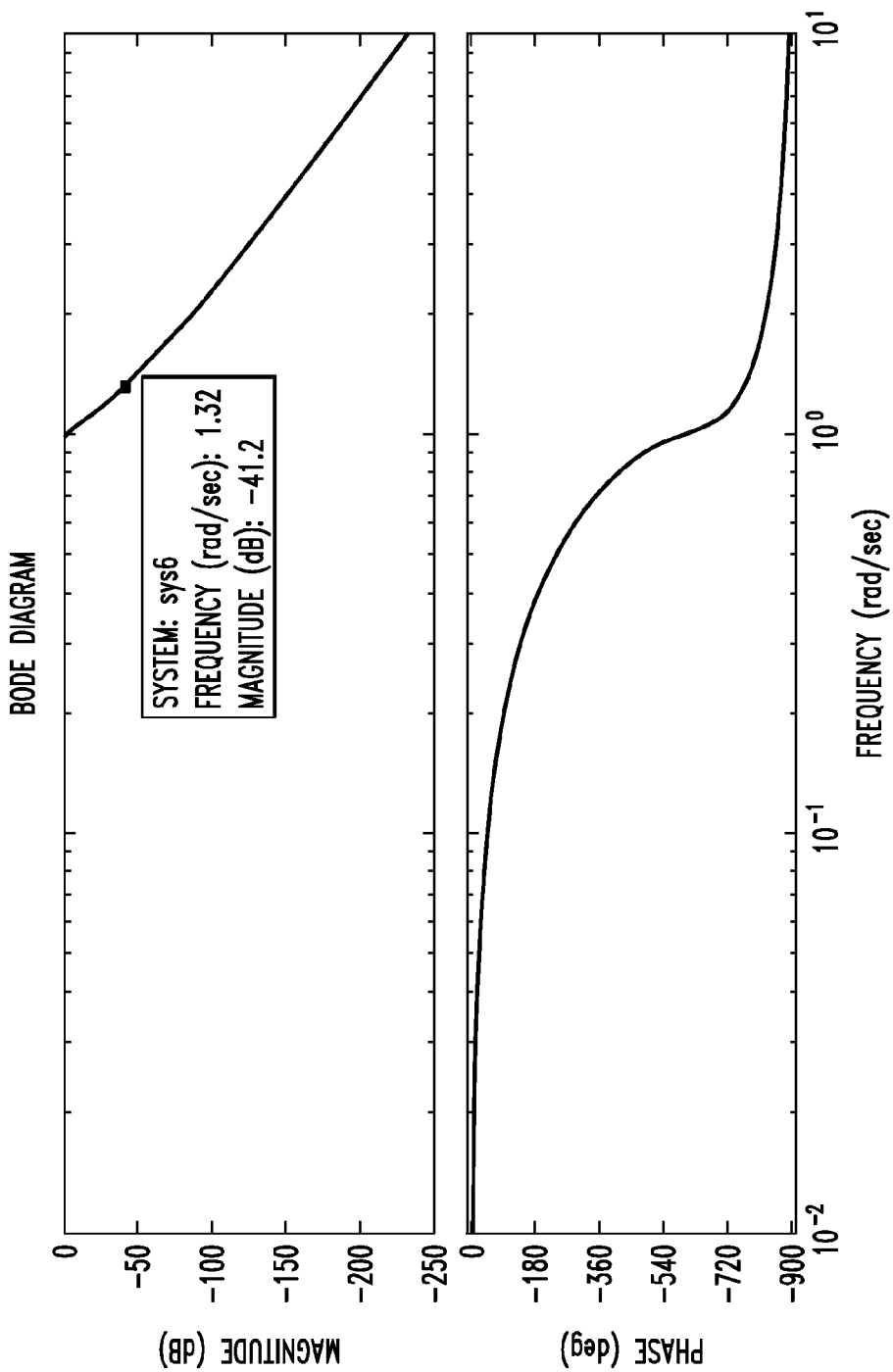
FIGS. 3 and 4 are Bode plots for an exemplary Papoulis filter of order N=10.
Figure 4:
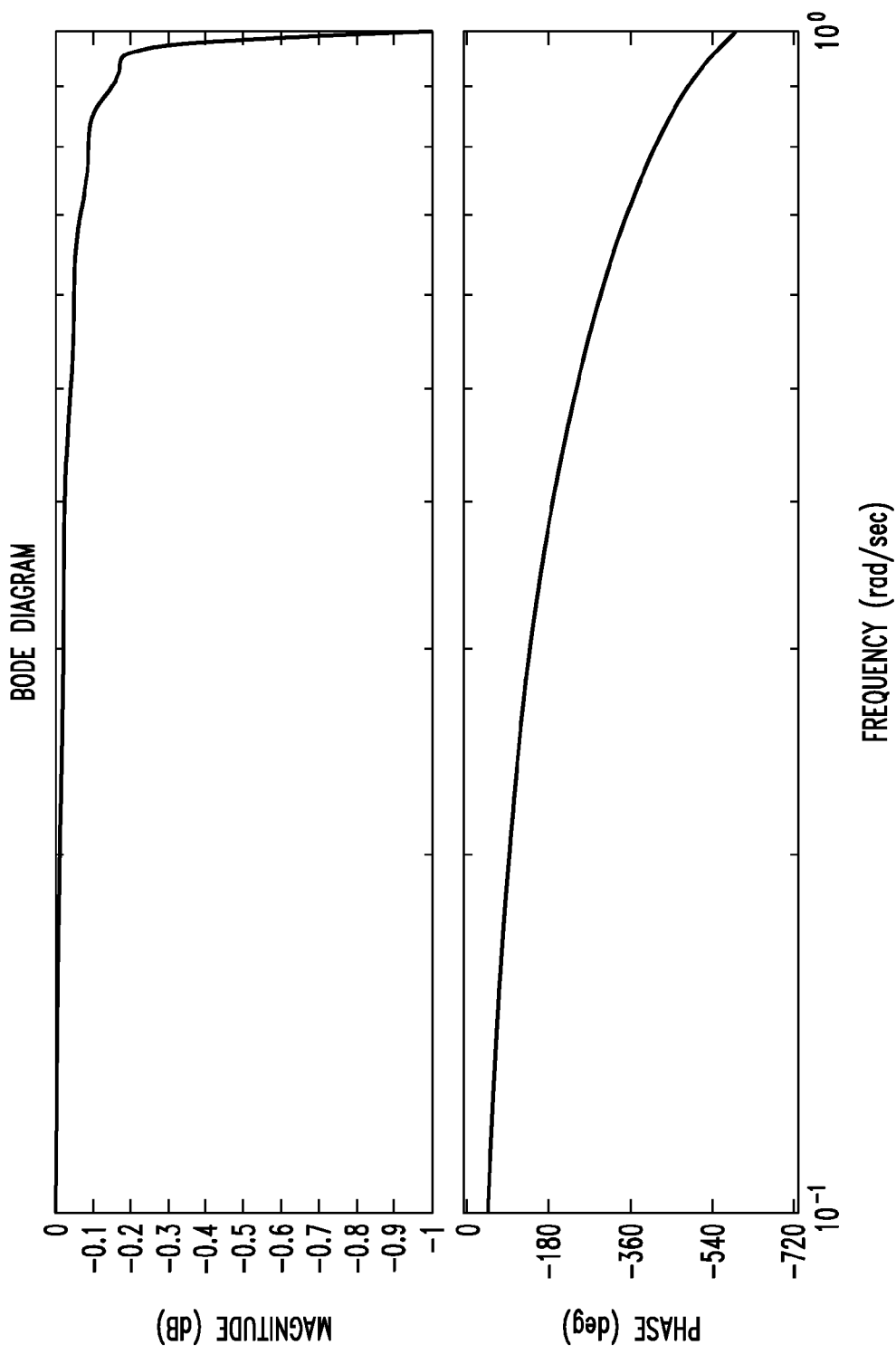
Figures 5, 6:
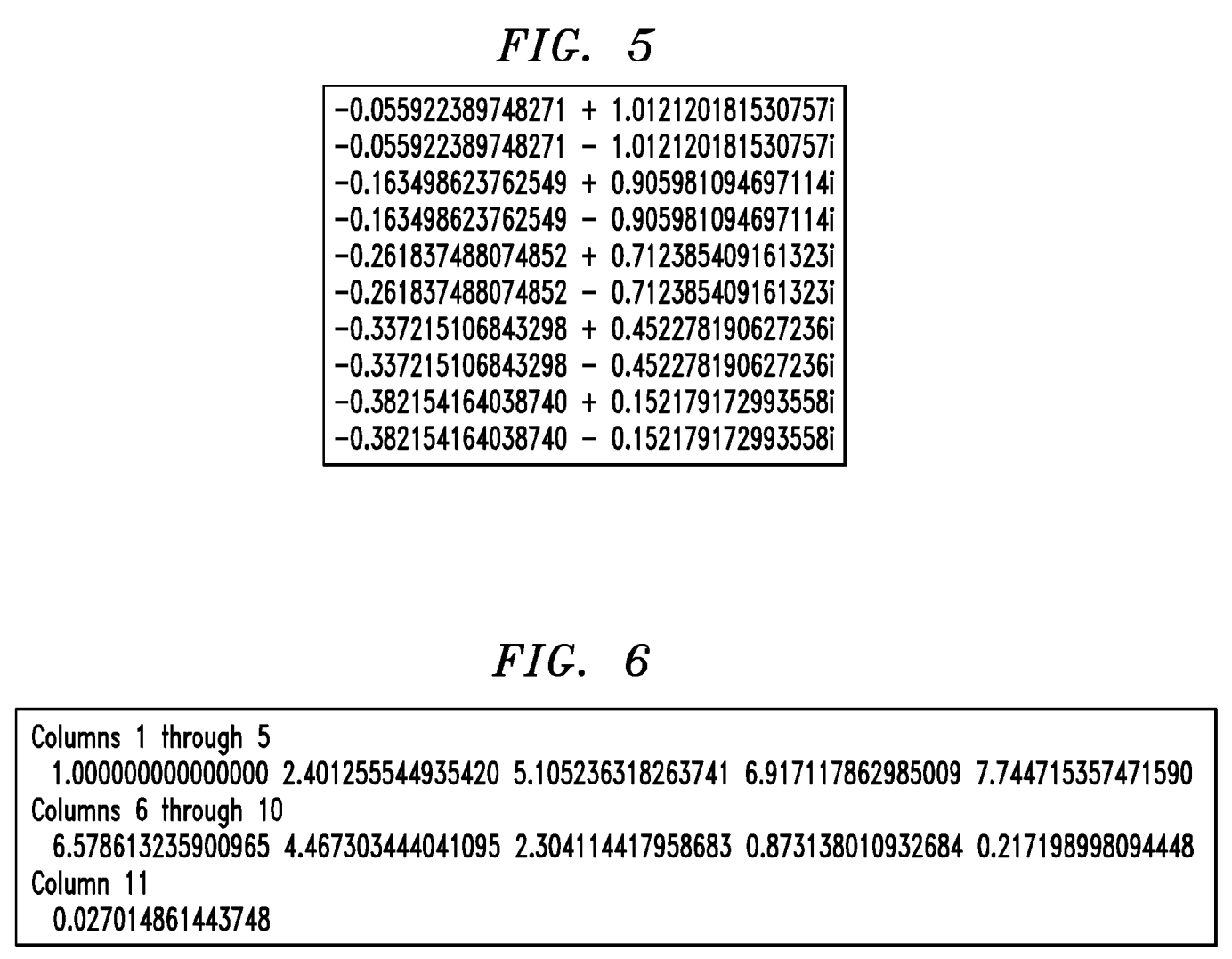
Figure 7:
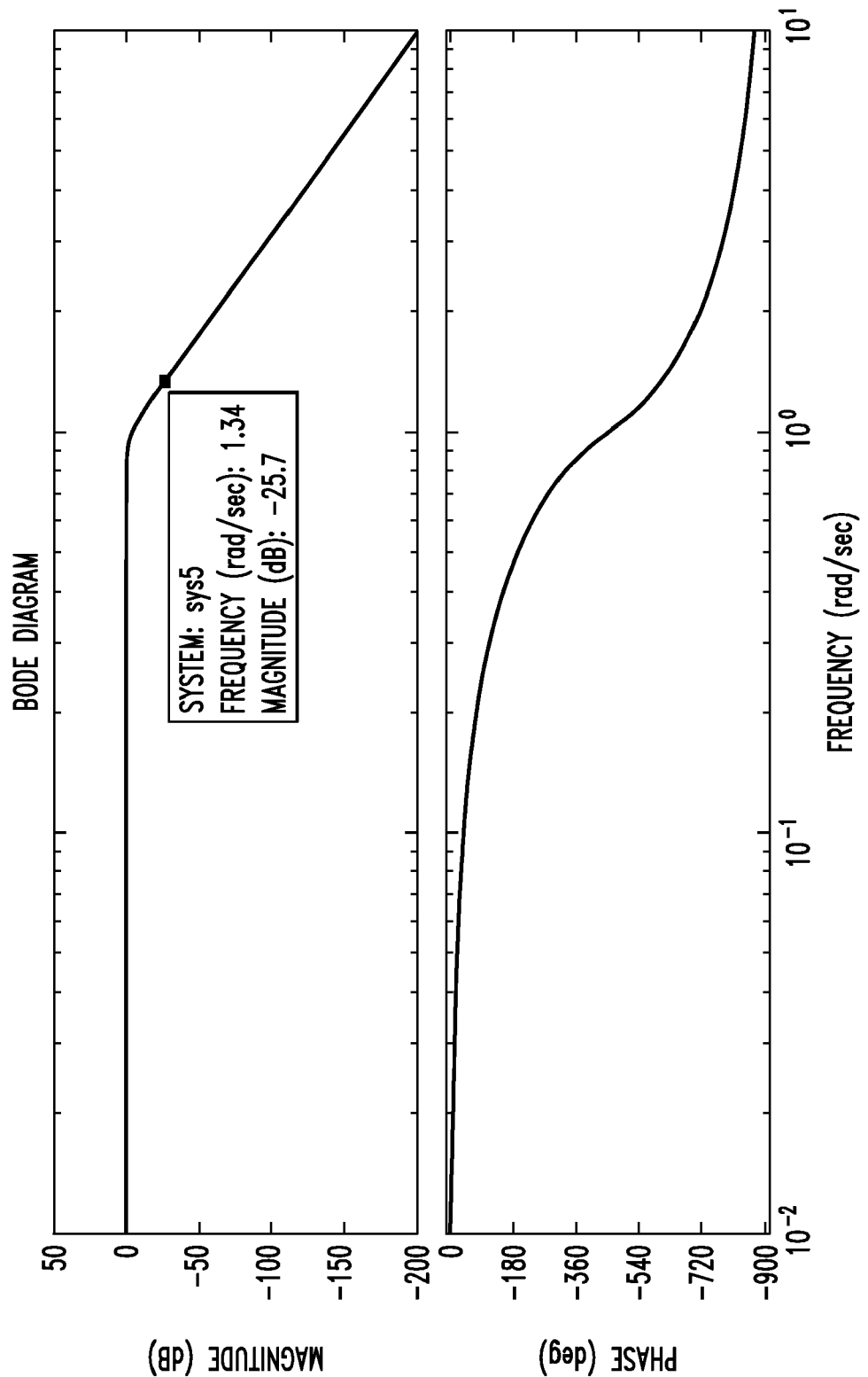
FIGS. 7 and 8 are Bode plots for an exemplary Butterworth filter of order N=10.
Figure 8:
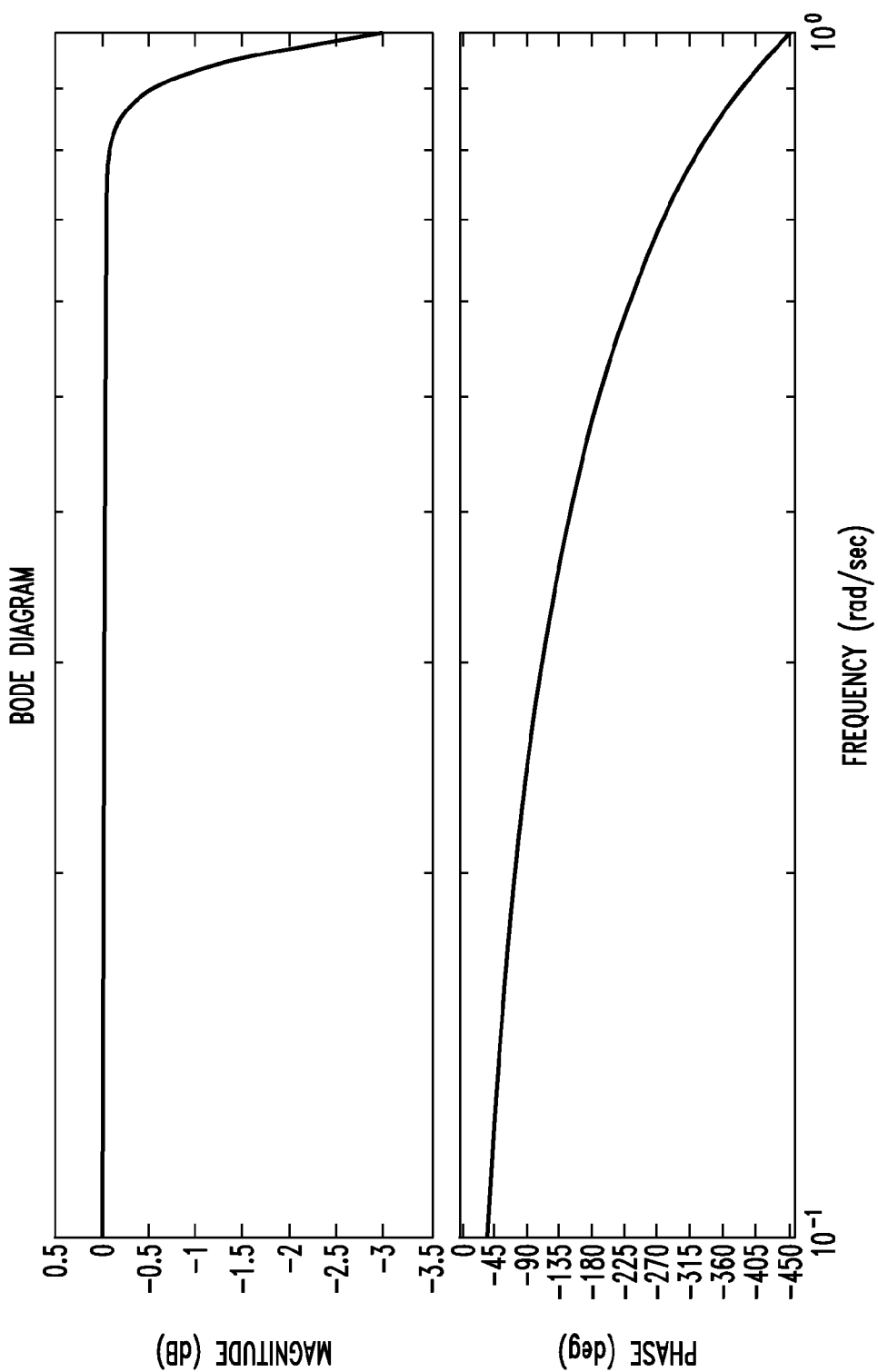
Figure 9:
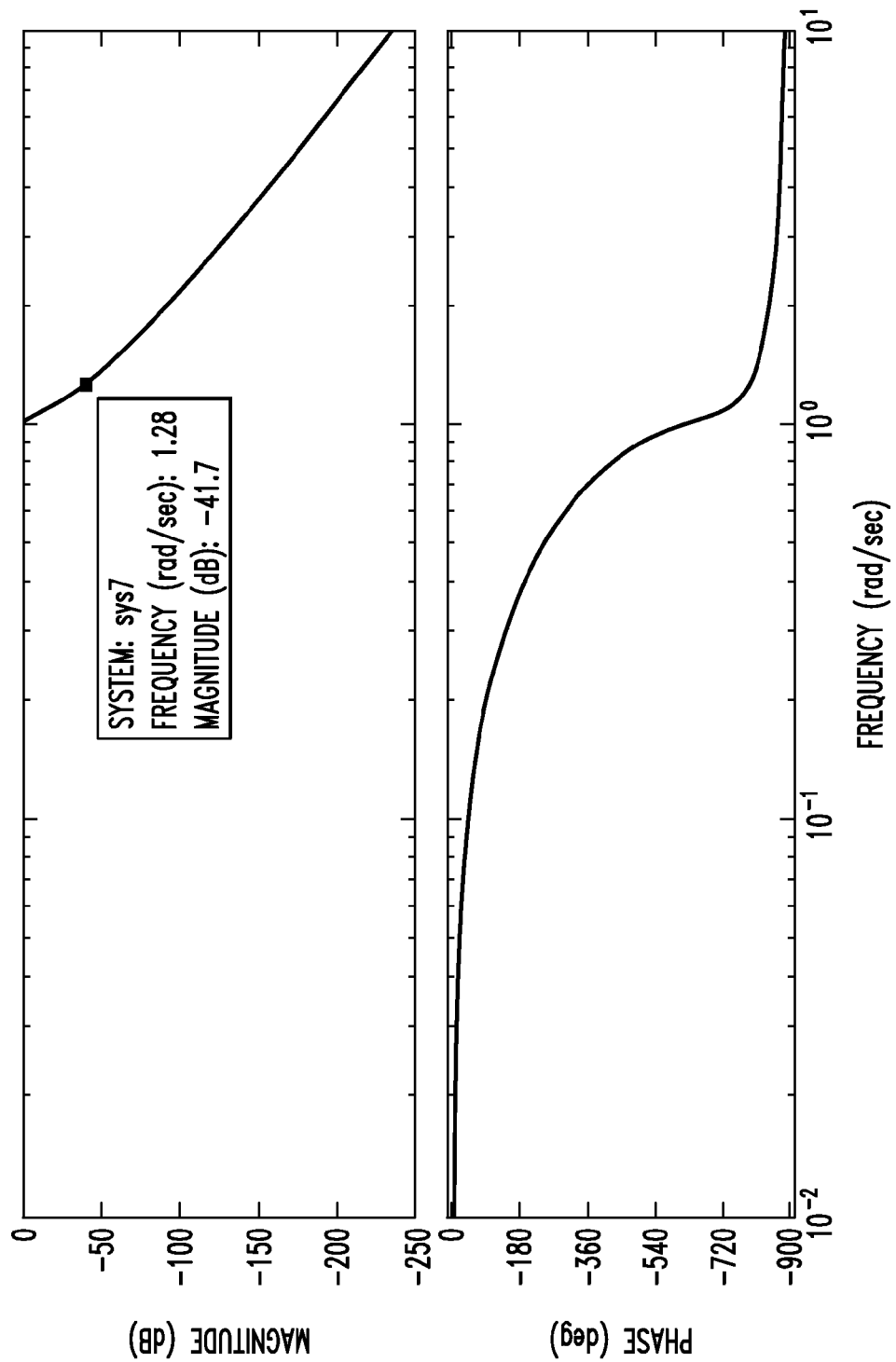
FIGS. 9 and 10 are Bode plots for an exemplary Chebyshev I filter of order N=10
Figure 10:
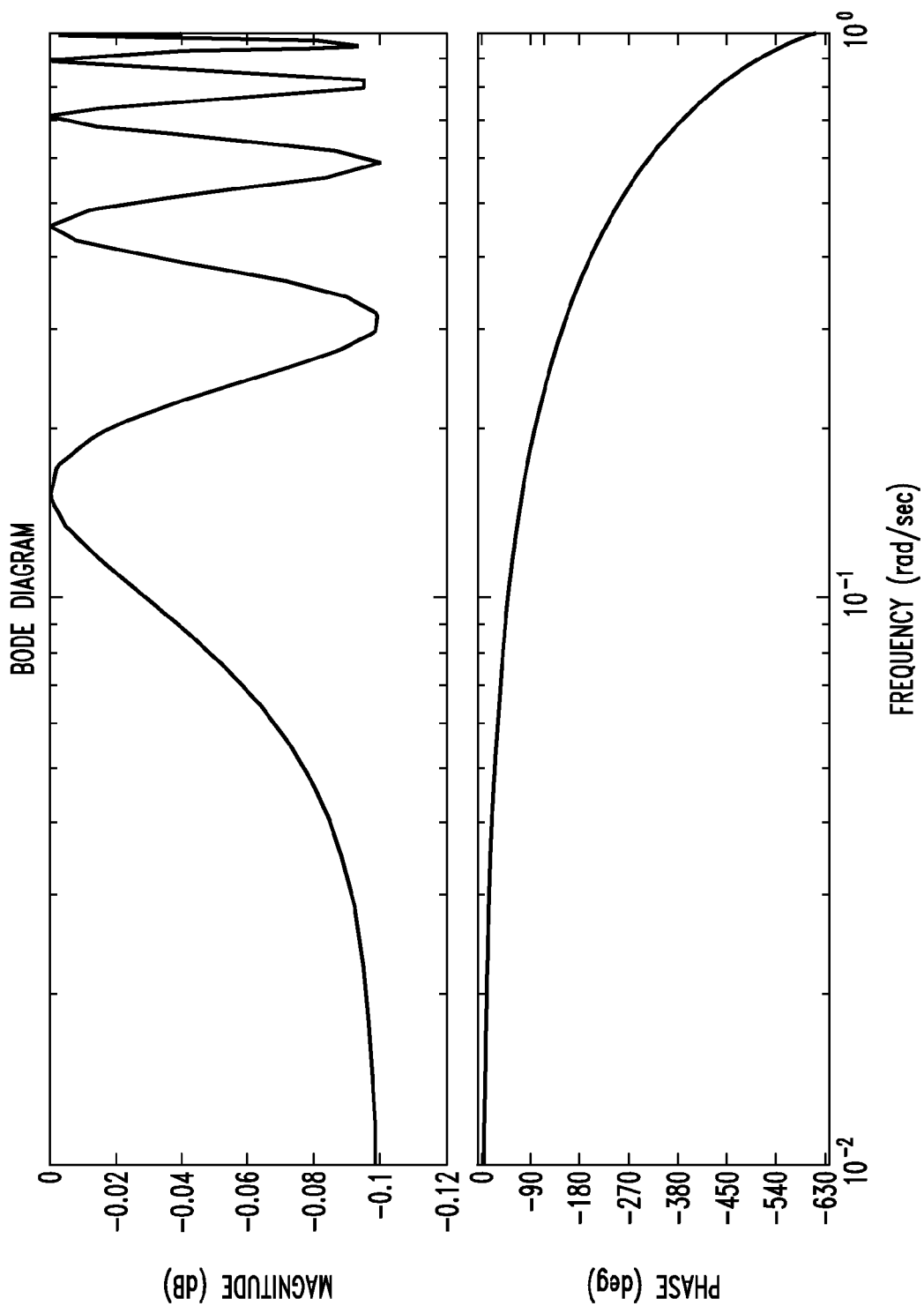

Papoulis filters are described in A. Papoulis, Optimum Filters with Monotonic Response, Proceedings IRE, vol. 46, no. 3, pages 606-609, March 1958; and A. Papoulis, On Monotonic Response Filters, Proceedings IRE, vol. 47, pages 332-333, February 1959; both of which publications are expressly incorporated herein by reference in their entirety for all purposes, although it is believed that the skilled artisan will be familiar with same in and of themselves. A Papoulis filter is an all-pole filter with no zeroes (as is a Butterworth filter). Accordingly, sharp transition bands cannot be obtained. Nevertheless, for the same order, the Papoulis filter is sharper than a Butterworth. The Papoulis filter has superior (lower) group delay compared to the Butterworth. The Papoulis filter has comparable transition band as a Chebyshev I type filter (equiripple in pass band) but with a lower group delay. Small group delay is significant for digitally modulated signals used in communications, and is attainable with Papoulis filters. Papoulis filters are seldom used but can be built using unity gain amplifiers. FIGS. 3 and 4 show a Bode diagram for a Papoulis filter of order N=10. Note the attenuation of −41.2 dB at 1.32 Hz (normalized frequency). FIG. 5 tabulates the complex conjugate poles for same; while FIG. 6 shows the denominator coefficients in the transfer function ($s^{10}$, $s^9$, ..., $s^1$, $s^0$) for same. FIGS. 7 and 8 show a Bode diagram for a Butterworth filter of order N=10. Note the attenuation of −25.7 dB at 1.32 Hz (normalized frequency). FIGS. 9 and 10 show a Bode diagram for a Chebyshev I filter of order N=10. Note the attenuation of −41.7 dB @1.28 Hz (normalized frequency). Note that the Chebyshev I filter has zeroes. Note also that the frequencies are normalized and the performance will rank in the same manner at practical frequencies of interest. FIG. 11 shows the numerator and denominator coefficients for the Chebyshev I filter.

Figure 12:
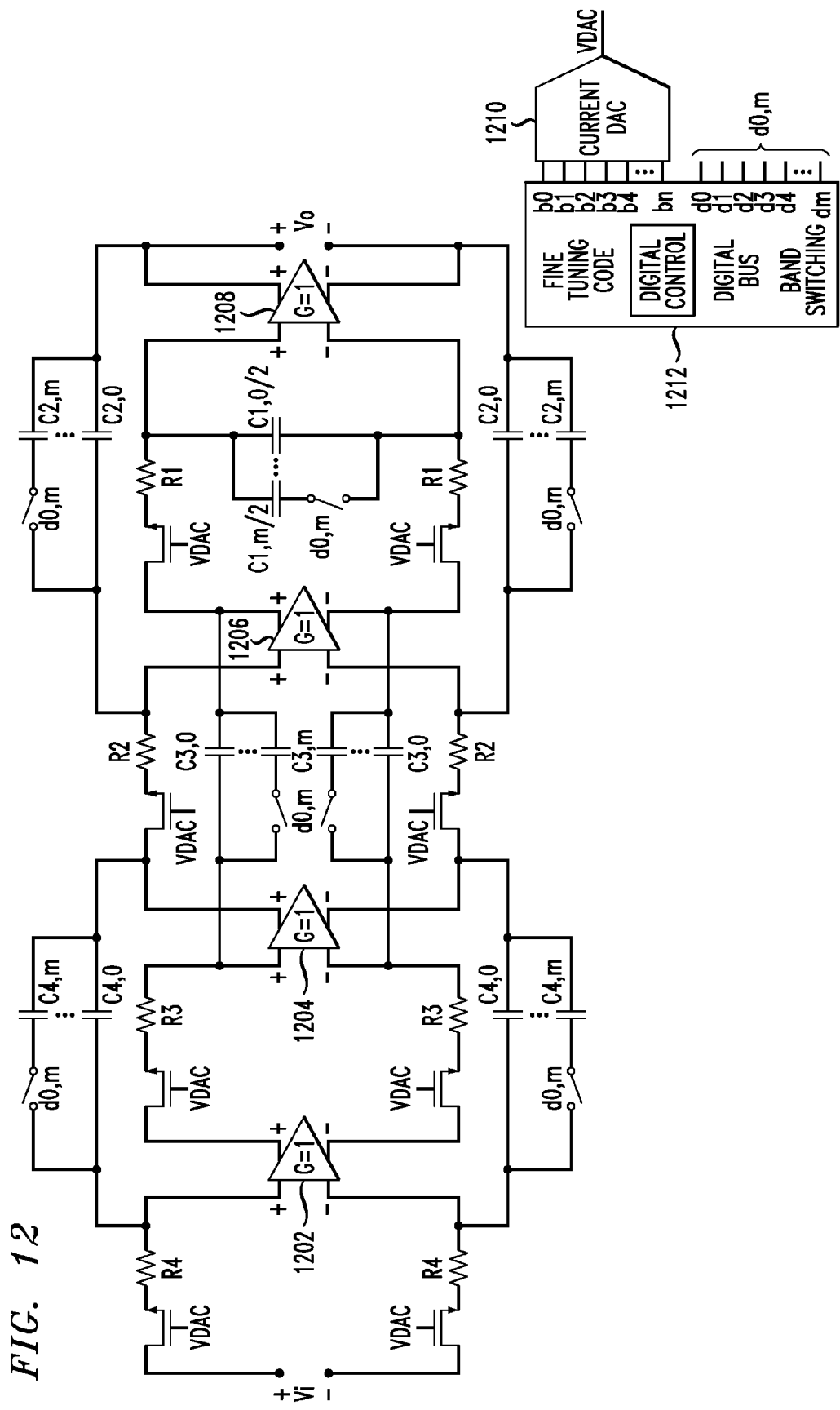
FIG. 12 depicts an exemplary Papoulis filter implementation, of order N=4, according to an aspect of the invention.

FIG. 12 shows a non-limiting exemplary Papoulis filter implementation, with order N=4, according to an aspect of the invention. Note differential unity-gain amplifiers 1202, 1204, 1206, 1208. Note positive terminal of differential input voltage V1 coupled to positive input of first unity gain differential amplifier 1202 through a variable resistance including fixed resistor R4 and a controllable portion discussed further below, the positive output of 1202 which is coupled to the positive input of second unity gain differential amplifier 1204 through a variable resistance including fixed resistor R3 and a controllable portion discussed further below; the positive output of 1204 which is coupled to the positive input of third unity gain differential amplifier 1206 through a variable resistance including fixed resistor R2 and a controllable portion discussed further below; the positive output of 1206 which is coupled to the positive input of fourth unity gain differential amplifier 1208 through a variable resistance including fixed resistor R1 and a controllable portion discussed further below; and the positive output of 1208 which is the positive terminal of the differential output voltage V0. Note also the variable capacitance C1, to be discussed further below, between the positive and negative inputs of 1208; variable capacitance C2, to be discussed further below, coupling the positive input of 1206 and positive output of 1208; variable capacitance C3, to be discussed further below, coupling the positive input of 1204 and positive output of 1206; and variable capacitance C4, to be discussed further below, coupling the positive input of 1202 and positive output of 1204.

Note also negative terminal of differential input voltage V1 coupled to negative input of first unity gain differential amplifier 1202 through a variable resistance including fixed resistor R4 and a controllable portion discussed further below, the negative output of 1202 which is coupled to the negative input of second unity gain differential amplifier 1204 through a variable resistance including fixed resistor R3 and a controllable portion discussed further below; the negative output of 1204 which is coupled to the negative input of third unity gain differential amplifier 1206 through a variable resistance including fixed resistor R2 and a controllable portion discussed further below; the negative output of 1206 which is coupled to the negative input of fourth unity gain differential amplifier 1208 through a variable resistance including fixed resistor R1 and a controllable portion discussed further below; and the negative output of 1208 which is the negative terminal of the differential output voltage V0. Note also the variable capacitance C2, to be discussed further below, coupling the negative input of 1206 and negative output of 1208; variable capacitance C3, to be discussed further below, coupling the negative input of 1204 and negative output of 1206; and variable capacitance C4, to be discussed further below, coupling the negative input of 1202 and negative output of 1204.

The number of resistors, capacitors, and amplifiers determines the order of the filter. Purely for simplicity and not by virtue of limitation, N=4 is shown. The skilled artisan, given the teachings herein, will readily be able to build filters of different orders.

As seen in the non-limiting example of FIG. 12, a variable (controllable) resistance can be provided by splitting the total resistance into a fixed portion (e.g., R1, R2, R3, R4) and a controllable portion. This latter portion can be, for example, a MOSFET operating in the linear region (triode mode) with the signal VDAC applied to the gate. The signal VDAC is applied to the gate of the MOSFET in the linear region to control the resistance. In one or more embodiments, resistance values change in small steps, inasmuch as VDAC is an analog discrete value generated from a current DAC 1210 and is monotonic by design. In one or more embodiments, this aspect can achieve fine tuning.

In one or more embodiments, coarse tuning (e.g., band switching) can be carried out, for example, using discrete switching of capacitors (e.g., C1, C2, C3, C4) which provide quantized changes in capacitance (i.e., they are switched in the circuit or not). In particular, each variable capacitance can be provided with m+1 capacitors numbered 0 through m; for example, C2,0 through C2,*m*; C3,0 through C3,*m*; C4,0 through C4,*m*; and (C1,0)/2 through (C1,*m*)/2. This latter notation re C1 is adapted for consistency with FIG. 2 which depicts two fixed capacitors of value C1 in series; in a differential implementation the value of the capacitor C1 is halved or it is possible to explicitly use two capacitors C1 in series with a value C1 (the total capacitance seen from the resistor R1 terminal is in fact C1/2; hence the notation).

A suitable digital control block 1212 includes a digital control, digital bus, fine tuning code to control inputs b0 through bn to the current DAC 1210, and band switching functionality to control the switches d0,*m* to switch the capacitors in and out of the circuit.

Figure 13:
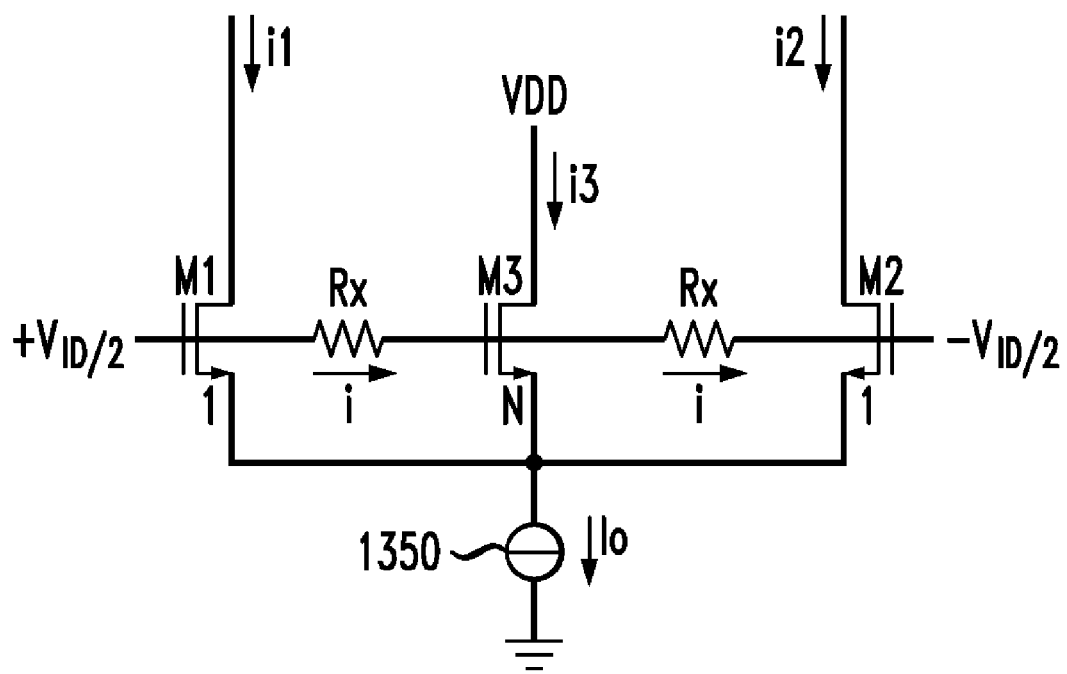
FIGS. 13-15 depict aspects of a unity gain amplifier implementation, according to an aspect of the invention.
Figure 14:
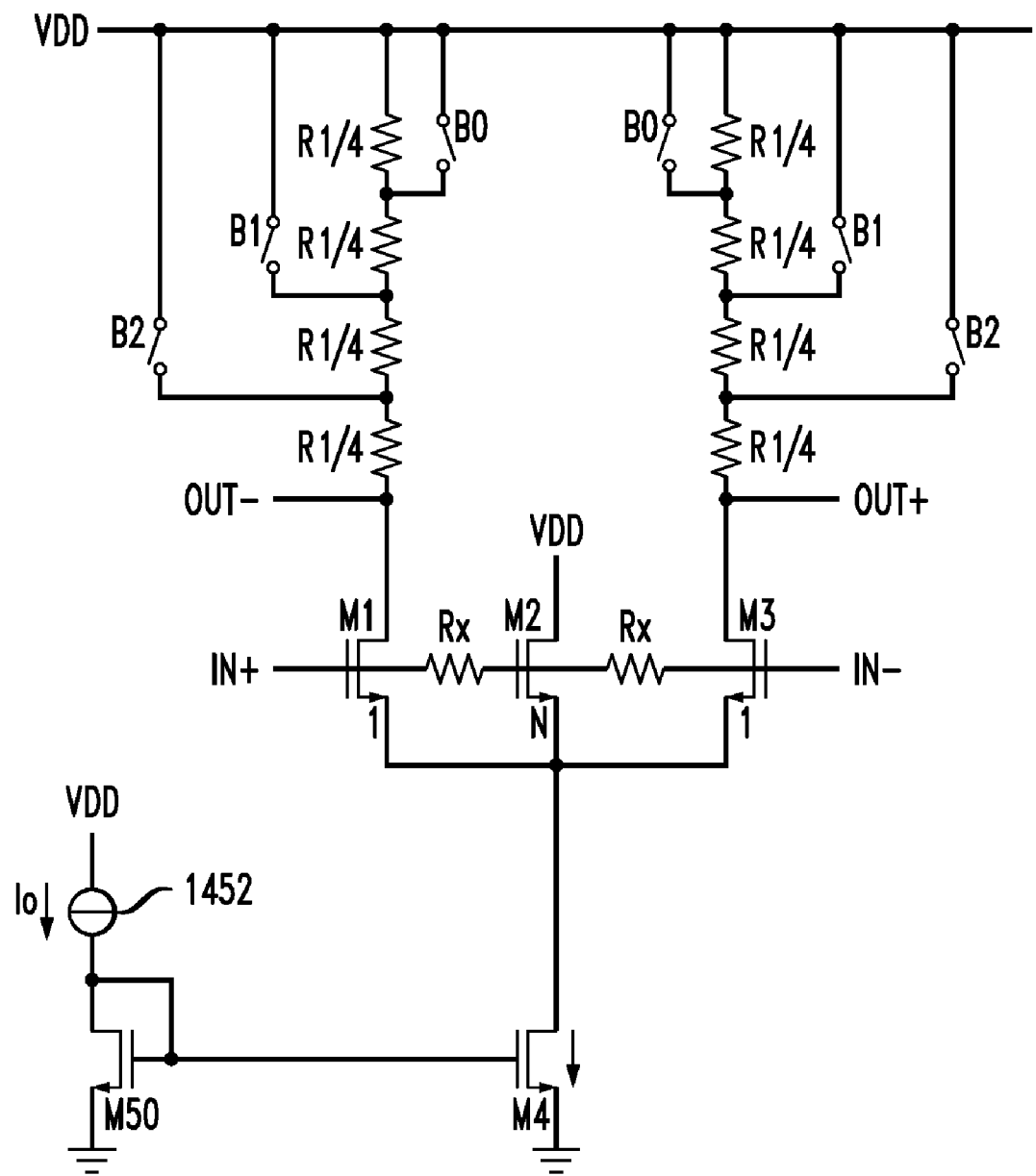
Figure 15:
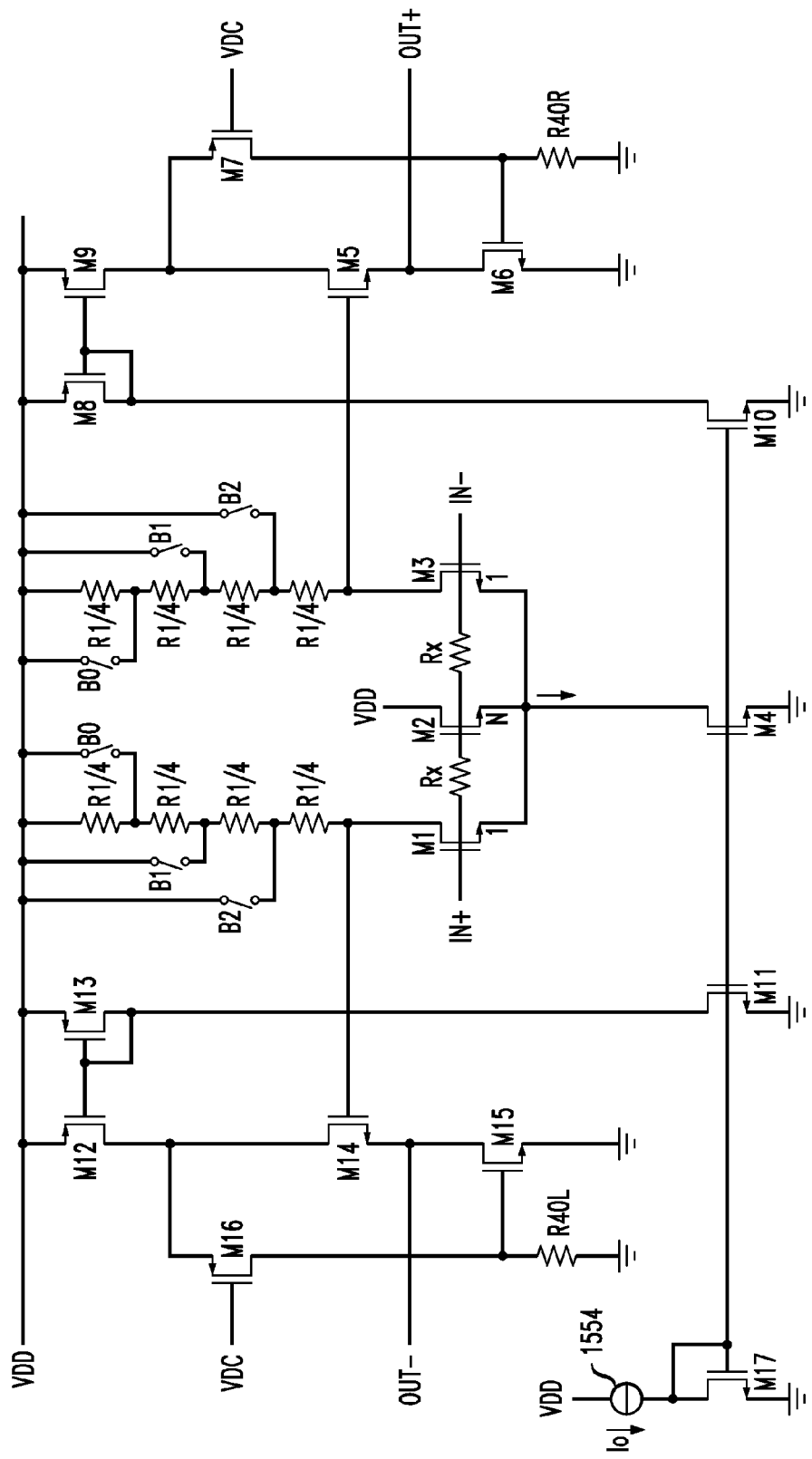

Refer now to FIGS. 13-15 which depict an exemplary Unity Gain Amplifier Implementation, according to an aspect of the invention. As best seen in FIG. 13, the same can be achieved with three field effect transistors (FETs) M1, M2, and M3, and a current source 1350. FET M3 is N times larger than FETs M1 and M2. The gates of the FETs are connected through resistors Rx. In a pure differential mode, the gate of M3 is a virtual ground. If there is a distortion component, it passes through M3 and not through the current loop. Thus, a linearized operational transconductance amplifier (OTA) stage with N≧2 is provided. In one or more embodiments, linearization can be achieved without voltage room penalty; differential input impedance is decoupled from the linear range, and large differential signals can be allowed at the input. In the formula for i1-i2, the parameter K is the well-known constant in the equation for $i_D$, namely, ½ $\mu_n$ $C_{ox}$ (W/L).

FIG. 14 shows the stage of FIG. 13 with the drains of M1 and M3 each connected to supply voltage VDD via a total resistance R divided into four equal portions controlled by switches B0, B1, B2, providing digital control of the gain. Note that in one or more embodiments, gains of unity or greater than unity are acceptable for correct operation. Current source 1350 is replaced by source 1452 and current mirror arrangement of transistors M4 and M50; M4 helps in achieving common-mode rejection.

With reference now to FIG. 15, note that a linear intermediate stage is preferred in one or more embodiments (this stage has high linearity and less distortion components; together with a buffer it provides DC compatibility and impedance transformation for driving large capacitive loads). In FIG. 15, an active buffer with unity gain and high linearity is added to the arrangement of FIG. 14. The gain cells are input/output DC compatible. The input and output common mode voltages are equal. Large bandwidths with high linearity are possible. The bandwidth is limited by the gain bandwidth product (GBW) of the process.

Note current mirror formed by current source 1554 together with transistors M4, M10, and M11. The current of M10 and M11 is mirrored again in the transistors M9 and M12 (note M8 and M13 with gate and drain tied). Note also the level shifters M16 and M7. The loop around M5 including the level shifter M7 together with R40R and M6 (the same applies for the left hand side loop around M14) has the purpose to force the current of M9 (derived from Io) in transistor M5. Therefore, its Vgs voltage is constant and any voltage variation present at its gate will be followed at its source undistorted. R40R and R40L have similar resistance values but are designated as L and R for left and right. The right side components M5, M6, M7, M8, M9, M10, and R40R are analogous to the left side components M14, M15, M16, M12, M13 and R40L.

One or more embodiments achieve input/output common mode compatibility which is desirable inasmuch as DC is needed to bias the FET gates; concatenation of stages (cascading) can thus be carried out. That is to say, the common mode is repeated allowing concatenation of stages (cascading) while maintaining DC compatibility for biasing of the FETs. Therefore, one or more embodiments do not require a common mode control loop, which reduces the potential for distortion (i.e., no need for common mode control at the output of gain cells).

Figure 16:
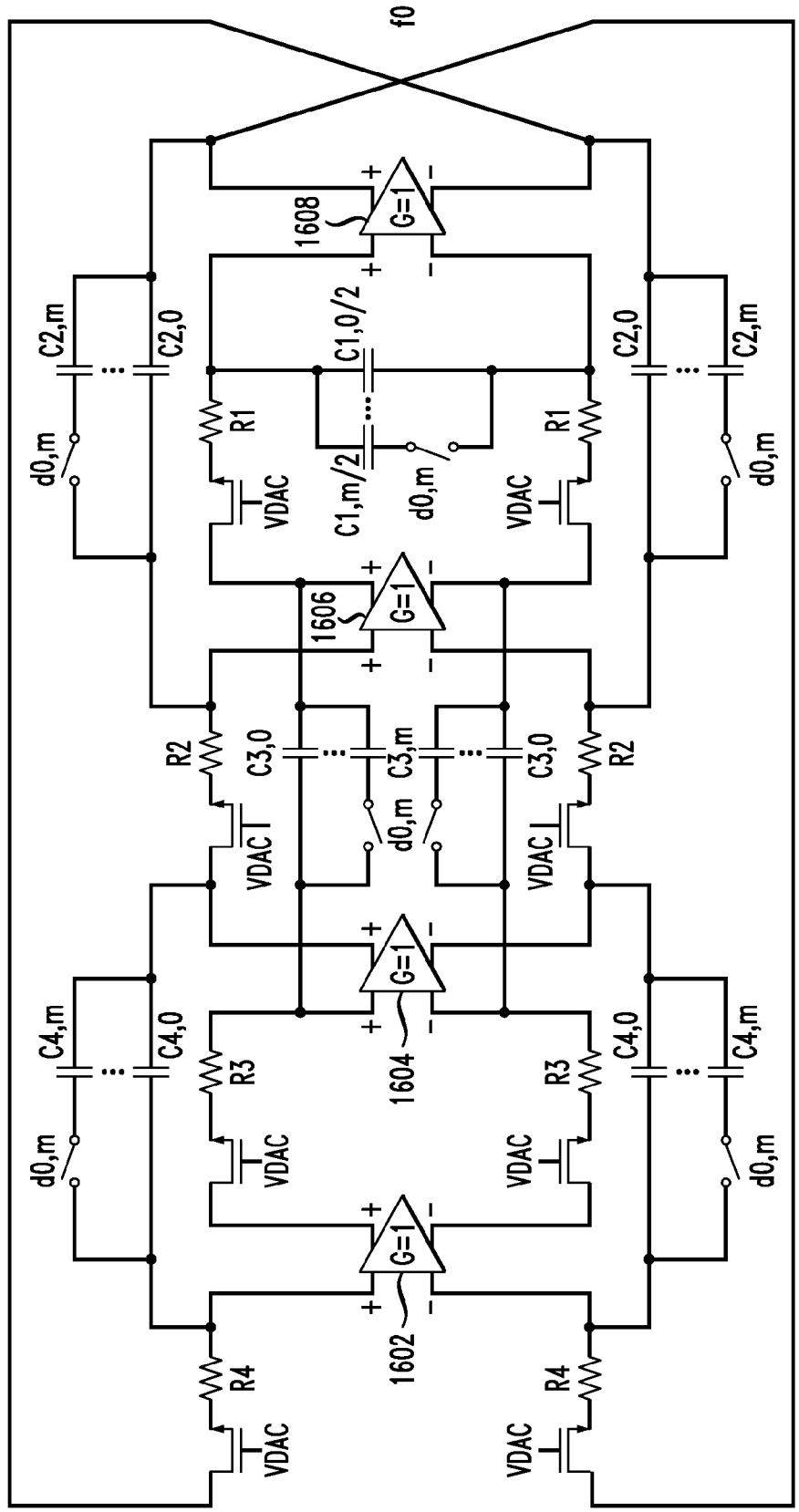
FIG. 16 depicts an exemplary Papoulis filter implementation, of order N=4, in oscillator mode, according to an aspect of the invention.

Attention should now be given to FIG. 16, which depicts an exemplary Papoulis Filter in Oscillator Mode. It is essentially similar to the corresponding portions of FIG. 12, except that differential amplifiers 1602, 1604, 1606, 1608 have greater than unity gain, and feedback is provided in that the positive output of 1608 is fed back to the negative input of 1602, and the negative output of 1608 is fed back to the positive input of 1602.

A tuning mechanism is desirable in one or more instances, and can be obtained as shown in FIG. 16 by using stages with gain >1, together with feedback, resulting in oscillation. The frequency of the oscillator is a consequence of the characteristics of the filter; it relates to the dominant pole in the filter. There is a correlation between the 3 dB bandwidth and the oscillation frequency; the filter typically oscillates on a frequency close to the pass band frequency. By making fine adjustments (changing R) or coarse adjustments (changing C), the frequency $f_0$ changes. If the filter bandwidth changes the oscillation frequency will track it. It is difficult to define this mathematically in a closed form, but it can be observed that the 3 dB bandwidth of the filter and the free running oscillation frequency $f_0$ track.

Figure 17:
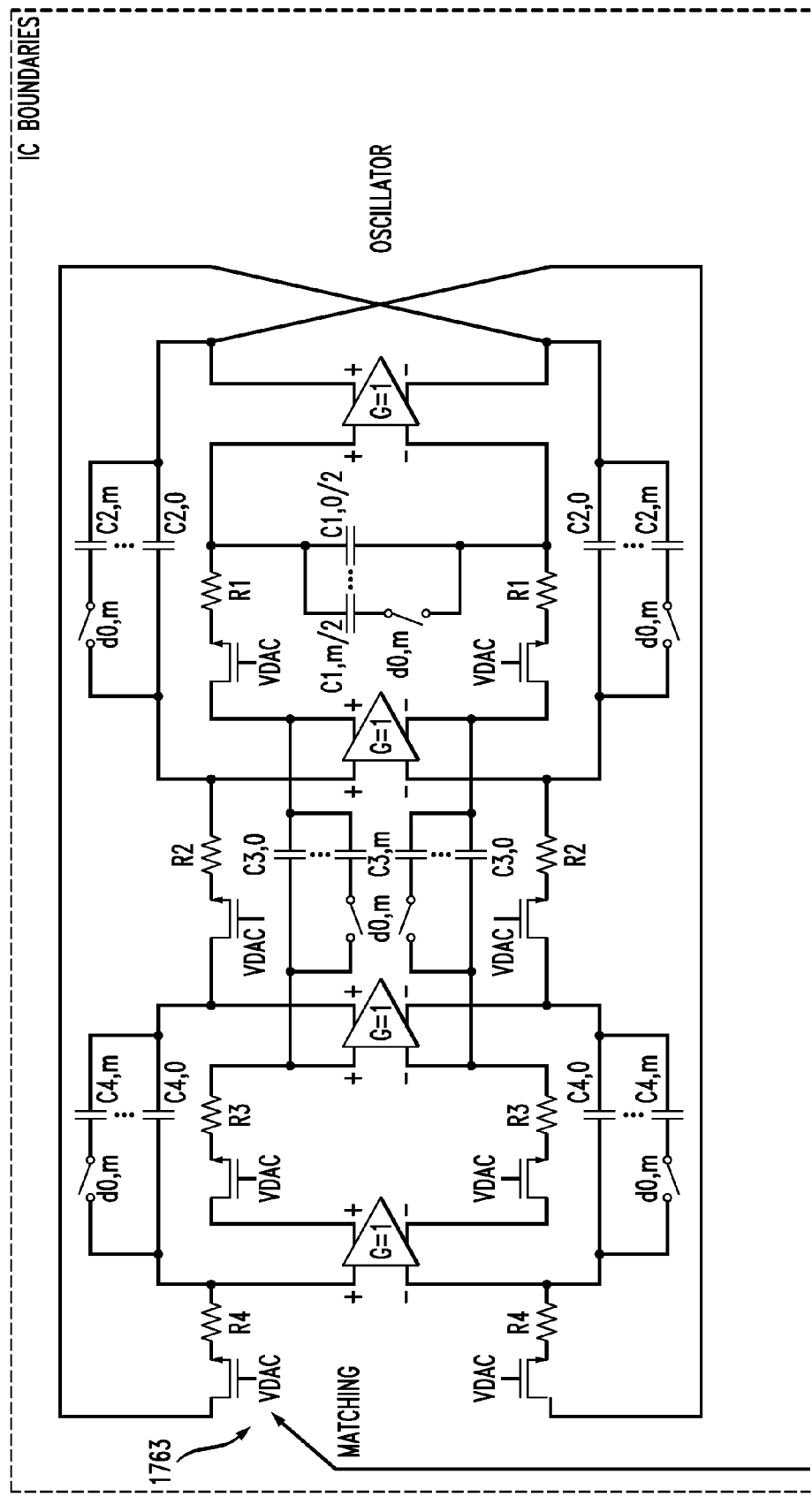
FIGS. 17 and 18 depict on-chip continuous calibration, according to an aspect of the invention.
Figure 17:
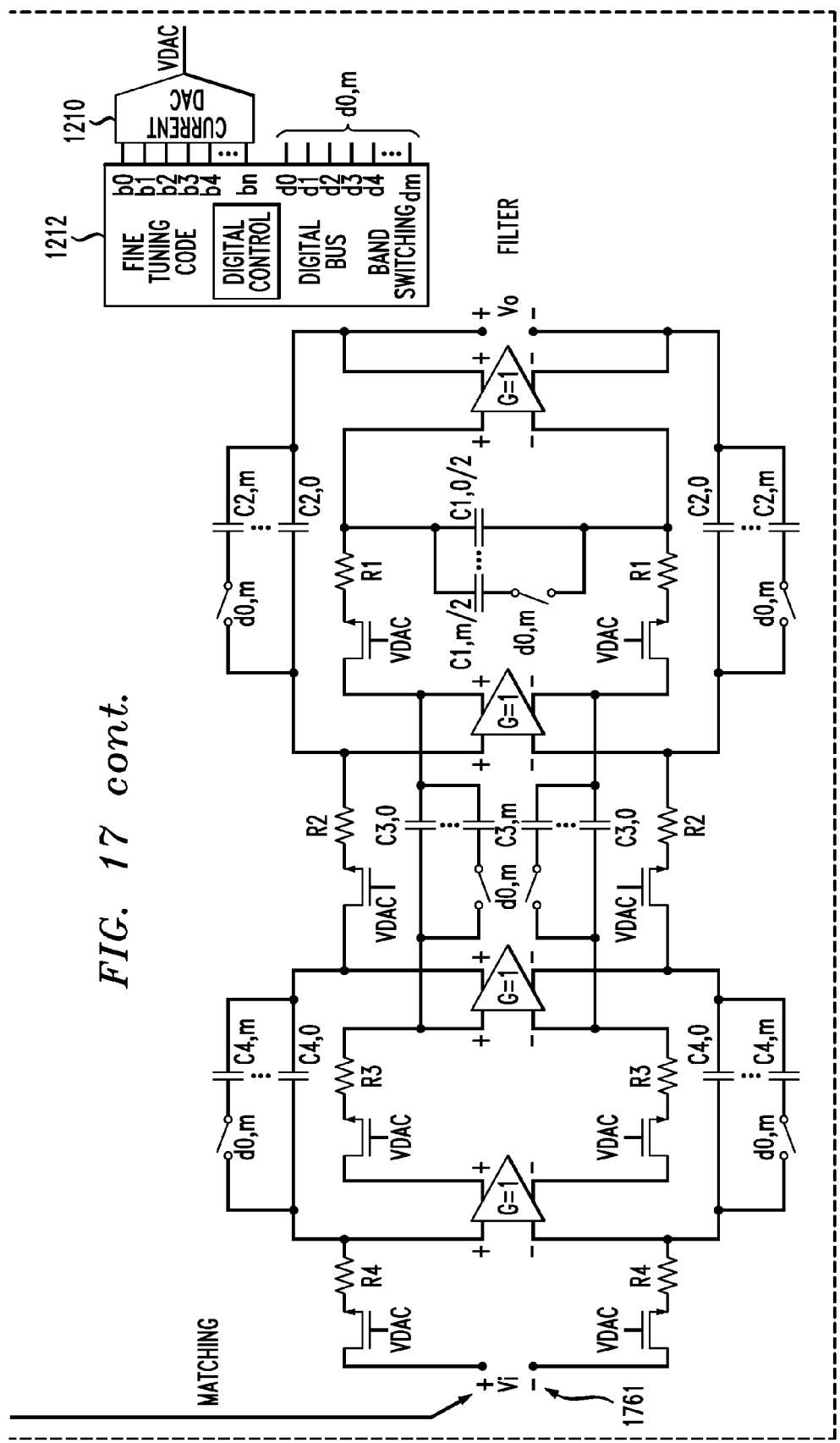
Figure 18:
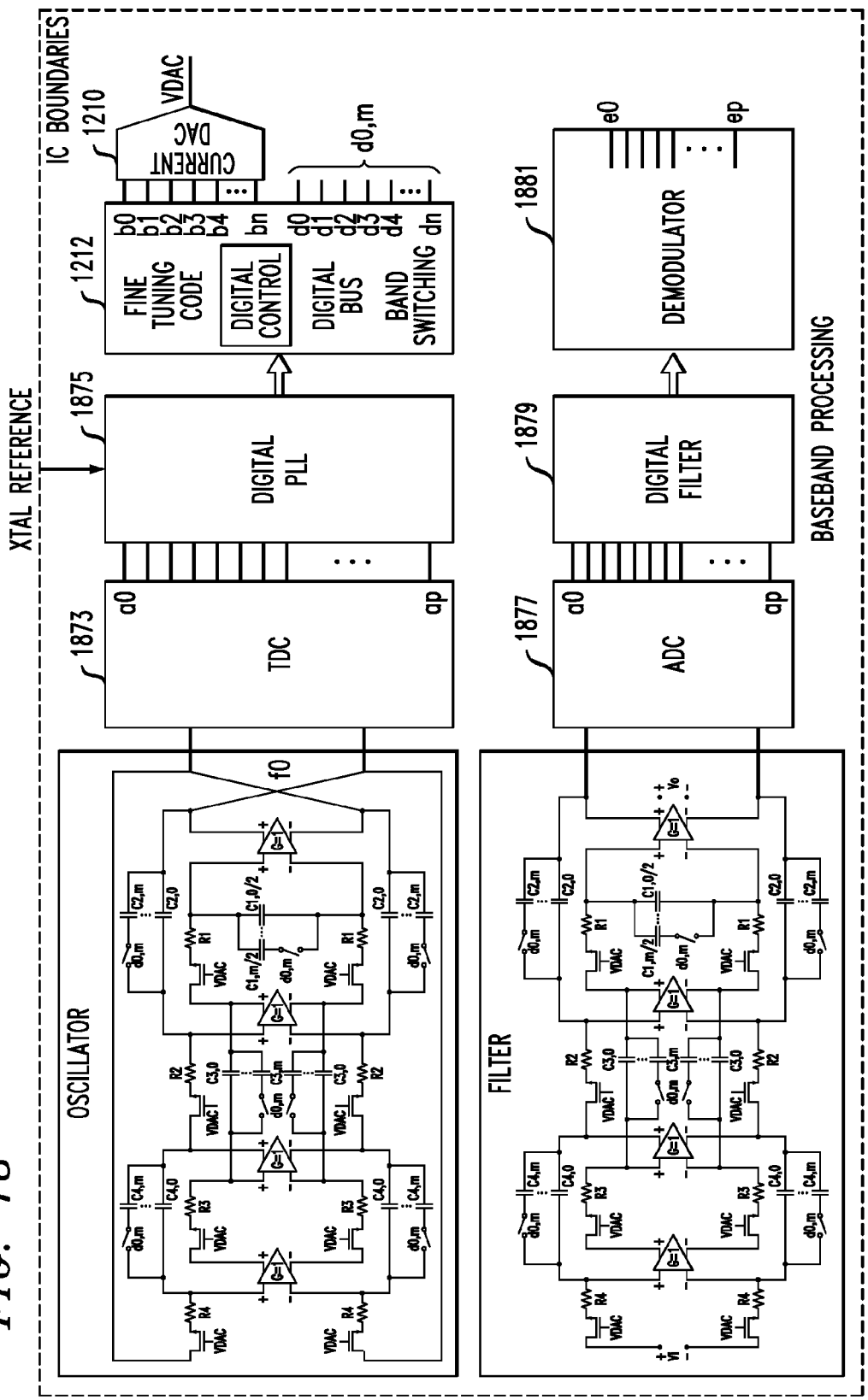

Exemplary On-chip Continuous Calibration is depicted in FIGS. 17 and 18. The filter is reproduced twice; once as a filter 1761, as described with respect to FIG. 12; and once as an oscillator 1763, as described with respect to FIG. 16. A single control block 1212 can be employed. Matching is a significant aspect, and calibration can be based on matching. Preferably, both the filter and oscillator (comprising a voltage controlled oscillator or VCO) are located in adjacent regions of the chip (see the IC boundaries indicated by the dotted line). In one or more embodiments, measure the oscillator frequency and compare it to a reference. The variables of the filter can be changed so that the oscillator frequency will match or be equal to the reference. The bandwidth of the filter will then track the oscillator. Thus, the frequency of the oscillator is compared to a reference; and an error signal is generated in a control loop to make the frequency of the oscillator equal to the reference. To re-state, both (i) the filter 1762 and (ii) an identical copy 1763 working in the oscillator mode (but of course with greater than unity gain amplifiers) are provided; they share control signals b0,$n$ and d0,$m$. By comparing f0 with a crystal reference, the filter bandwidth can be continuously monitored on the fly. By changing the reference and generating a digital error signal that drives b0,$m$, the filter bandwidth is changed to the new value via continuous calibration.

With reference FIG. 18, note time to digital (TDC) converter 1873, which generates a digital code from the time domain input which is a measure of the frequency. TDCs are themselves well known, and any suitable TDC can be employed. The digital phase-locked loop (PLL) 1875 compares the TDC output with a crystal reference (labeled "XTAL REFERENCE") and generates a differential error signal taken as an input by digital control block 1212. This is used to control variable R and switched C to match the desired frequency. The output of the filter can be provided to analog to digital converter 1877, then to digital filter 1879 and demodulator 1881 in a baseband processing aspect.

Figure 19:
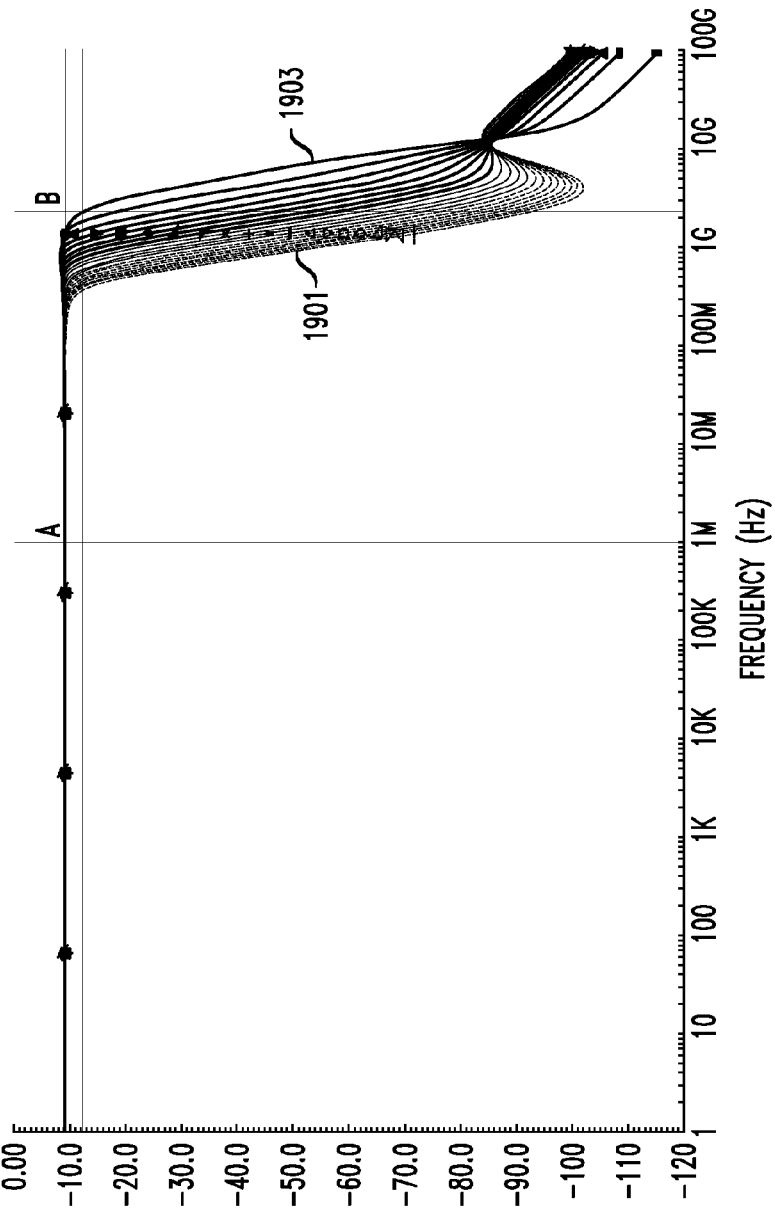
FIGS. 19-22 depict non-limiting exemplary simulation results, according to an aspect of the invention.
Figure 20:
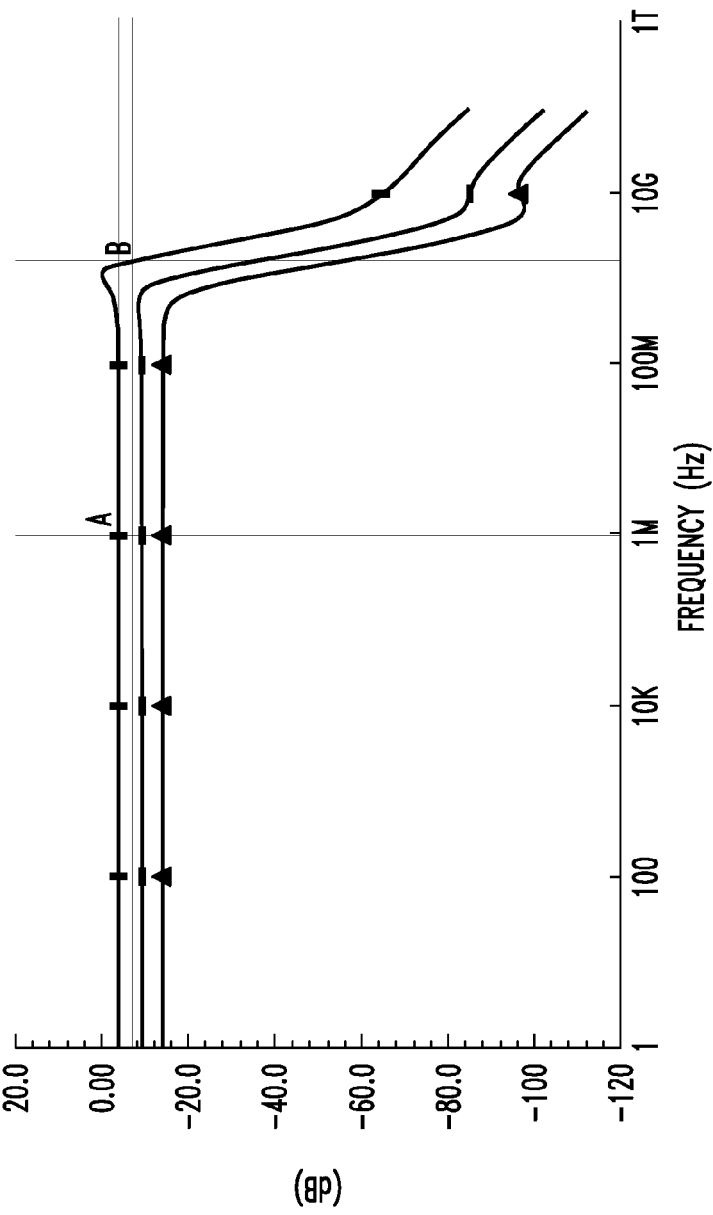
Figure 21:
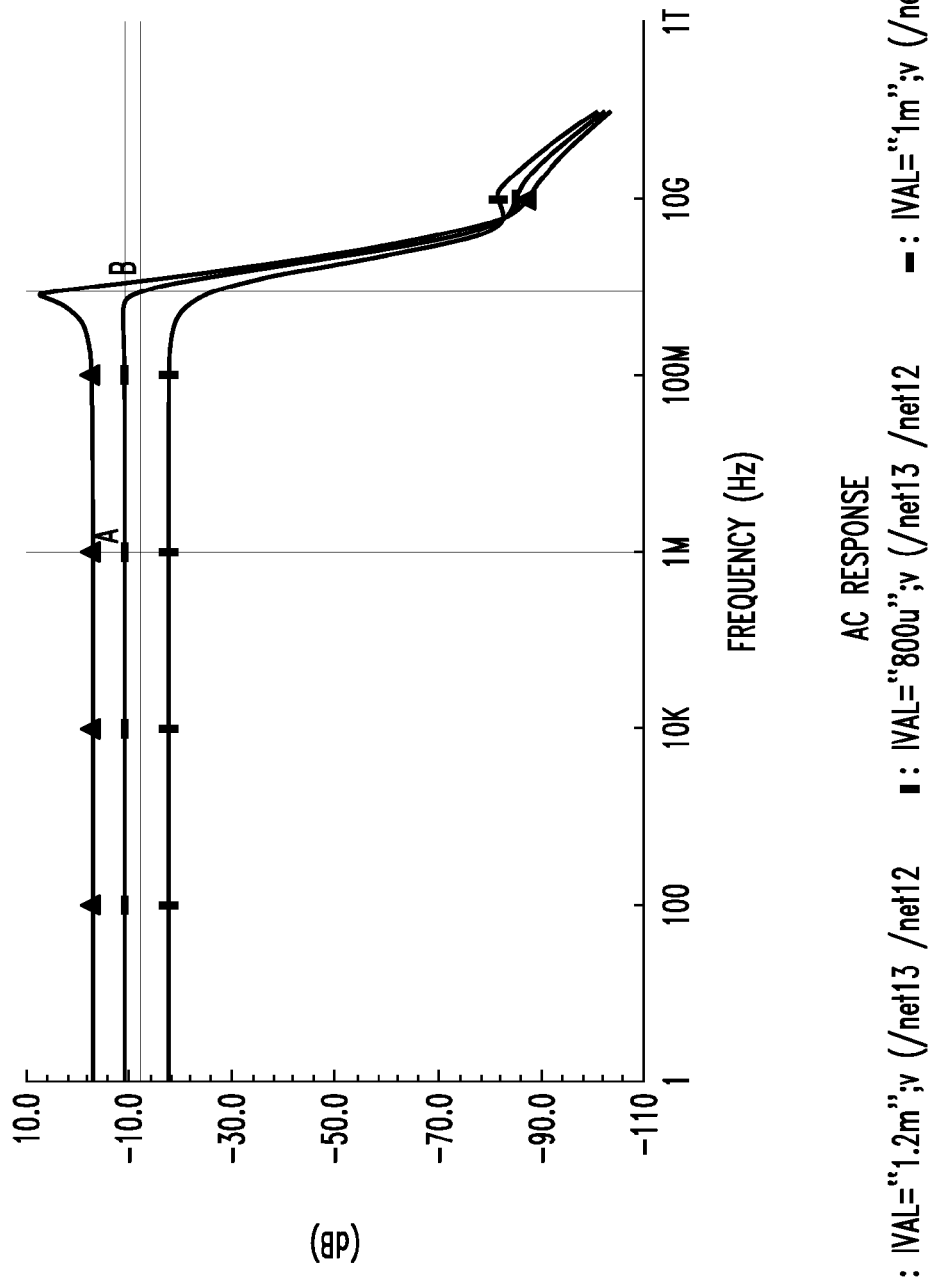
Figure 22:
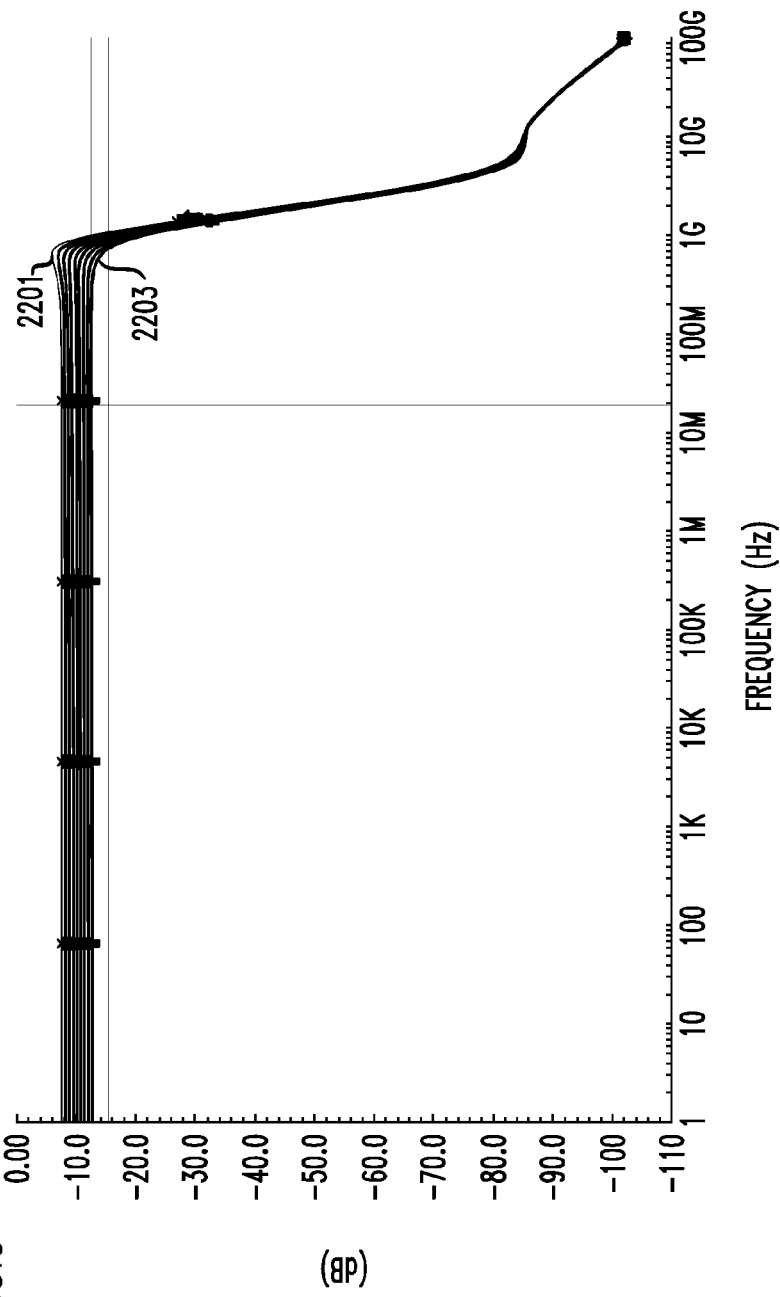

FIGS. 19-22 show non-limiting exemplary simulation results. FIG. 19 depicts the AC response for a Papoulis filter with N=7 and bandwidth of approximately 1 GHz. The passband characteristic is fine-tuned by changing R1 . . . Rn. Here R1=R2= . . . =R7=R; with Rmax/Rmin=20. Here, the capacitances C1, C2, . . . , C7 are not necessarily equal. Note that the peaking at 10 GHz is a second order effect and the attenuation in the stop band is about 80 dB. Alpha is a scaling factor for the resistors that allows simultaneous change in their values for simulation purposes. The ratio between ALPHA=5 to ALPHA=0.25 in FIG. 19 gives Rmax/Rmin=20 as mentioned above. Note that the curve values range from left-most curve 1901 with ALPHA=5 to right most curve 1903 with ALPHA=0.25, in intervals of 0.25. FIG. 20 shows how the impedance level (R values) determines filter losses and filter peaking. The top curve with tall rectangular points is for R=600Ω; the middle curve with short rectangular points is for R=1.2 kΩ; and the lower curve with triangular data points is for R=1.8 kΩ. In this particular non-limiting example, R=1.2 kΩ is the best choice. FIG. 21 shows how bias current of the unity gain amplifiers controls filter losses and filter peaking. The bottom curve with tall rectangular points is for I=800 microamps; the middle curve with short rectangular points is for I=1 milliamp; and the top curve with triangular data points is for I=1.2 milliamps. In this particular non-limiting example, I=1 milliamp is the best choice. FIG. 22 shows how the amplifier's gain, G, controls filter losses and stability. G is controlled from the resistive load of the linearized pair. When G>1, the filter starts oscillating. The oscillation frequency is at peaking frequency (R>450Ω). It should be noted in general that peaking and losses should be avoided; values of R can cause instability and excessive peaking can cause oscillation. Note also that the value R (RVAL) is the absolute value of the tunable resistors in FIG. 12. They give the impedance level for the filter and according to FIG. 20 this value determines the filter losses and peaking. In FIG. 20, for simplicity, all the tunable resistors are chosen equal. Note top curve 2201 with RVAL=400 and bottom curve 2203 with RVAL=360. The intermediate curves are in intervals of 5.

One or more embodiments provide a self-calibrated broadband tunable active Papoulis filter with only unity gain cells for multi-standard and/or multiband channel selection, workable at GHz frequencies (limited only by the gain-bandwidth product of the process), and having high linearity due to linearization techniques. Furthermore, one or more embodiments provide a configuration wherein the same filter topology is sued for the oscillation mode, allowing good on-chip matching with continuous calibration during operation (important for data communication). A digital PLL can be used for error signal and fine tuning, and only a small area is needed.

In one or more instances, an all-pole Papoulis filter is realized using unity-gain amplifiers without total feedback, OTAs or OP-AMPs, allowing larger bandwidths in excess of a few GHz. A significant building block for the filter is a unity-gain amplifier realized with a linearized pair and a buffer with local feedback. The gain of the amplifier G can be tuned in a digital manner with G=1 in a normal filter operation or G>1 in an oscillator configuration. The filter can be tuned via a configuration with the filter and its replica working as an oscillator. The oscillator is active and one or more embodiments do not use only one time constant for matching to the main filter. The whole filter performs the oscillator function; this oscillator is not an LC oscillator. For changing the position of the poles, capacitor banks as well as MOS resistors having a coarse-fine tuning mechanism can be employed.

In one or more embodiments, the tuning mechanism relies on transforming the output of the oscillator in a digital signal using a Time-to-Digital Converter (TDC) and having its output frequency as a digital code. The crystal (X-Tal) reference is compared in the digital domain to the oscillation frequency of the filter-oscillator and the error signal is used for tuning the pass-band response. In one or more instances, the filter has low-group delay due to Papoulis characteristic and due to large bandwidth of the unity-gain amplifiers. Continuous calibration (on-the-fly) is possible as the two functions (filter and oscillator) are separated. One or more instances can operate at large signal levels as the linearization of the first stage together with local feedback employed in the buffer allows operation with input differential signals (peak-to-peak) close to supply voltage ($V_{pp, differential, in}$~VDD). The digital PLL or DPLL involved in the calibration process preferably has a small form factor as the loop filter is not integrated as a large capacitance.

Again, one or more embodiments realize an active Papoulis filter as an all-pole filter with very small group-delay; of significance is the use of high-linearity unity-gain cells with MOS transistors, capacitors and tunable resistors (realized as well with MOS transistors and poly resistors). The group-delays of such filters are better than Butterworth filters of the same order and can be used for communications purposes. This filter can be tuned coarsely by switching capacitors and finely by using resistors and MOS transistors. The result is a filter that can be used for multi-band, multi-standard wireless transceivers for WPAN and next generation WPAN (802.11.3.c) or UWB. Furthermore, the filter can have a self-calibrating mechanism based on a crystal reference provided by a PLL integrated on the same IC process.

One or more embodiments advantageously provide one or more of the following advantages:
  can be implemented in modern technologies with high bandwidths (greater than 1 GHz) suitable for use in 60 GHz communications systems
  unlike op-amp based filters (MOSFET plus capacitance), do not have large gain requirements to create virtual ground at the input
  recue or eliminate linearity problems with OTA-C or Gm-C filters
  avoid limits on achievable Q due to second pole of OTA based integrator
  achieve sharp transition bands and large stop-band rejection
  low power consumption, especially compared to bi-quads with OTA-C filters
  less group-delay than filters with poles and zeroes; low group delay is important for data communications
  can operate at low voltages and provides a tunable passband characteristic
  can achieve self calibration and continuous operation
  can provide a multiband solution
  less chip area than L and C solutions Given the discussion thus far, it will be appreciated that, in general terms, an exemplary filter, according to an aspect of the invention, includes N unity gain amplifiers (such as 1202, 1204, 1206, 1208), N being at least two. Each of the unity gain amplifiers has a pair of differential input terminals and a pair of differential output terminals. The pair of differential output terminals of a last one of the N unity gain amplifiers (e.g., those of 1208) are the filter differential output terminals (between which is V0). Also included are a pair of filter differential input terminals (between which is Vi), and a first pair of variable resistances (e.g., R4 plus FET with VDAC on gate) coupling the pair of filter differential input terminals to the pair of differential input terminals of a first one of the N unity gain amplifiers (e.g., 1202). Furthermore, N−1 pairs of variable resistances (e.g., R3 plus FET with VDAC on gate, R2 FET with VDAC on gate, and R1 FET with VDAC on gate) couple the pairs of differential output terminals of each of the N unity gain amplifiers, other than the last one of the N unity gain amplifiers (e.g., 1208), to the pairs of differential input terminals of its downstream neighbor (that is, 1202 coupled to 1204, 1204 coupled to 1206). In addition, N−1 pairs of variable capacitances (e.g., C4,0 through C4,m; C3,0 through C3,m, and C2,0 through C2,m) couple the pairs of differential input terminals of each of the N unity gain amplifiers, other than the last one of the N unity gain amplifiers, to the pairs of differential output terminals of its downstream neighbor; and a variable capacitance (e.g., C1,0/2 through C1,m/2) couple the pair of differential input terminals of the last one of the N unity gain amplifiers (e.g., 1208) to each other.

The N unity gain amplifiers each in turn comprise a linearized operational transconductance amplifier stage (for example, as seen in FIG. 13) coupled to a corresponding pair of the differential input terminals, and a unity gain buffer with feedback interconnected between the linearized operational transconductance amplifier stage and a corresponding pair of the differential output terminals, as seen in FIG. 15.

The unity gain buffer with feedback includes an additional pair of field effect transistors M5, M14 having gates coupled to the drains of the second and third field effect transistors M3, M1 and sources coupled to the corresponding pair of differential output terminals (+ in the case of M5; − in the case of M14). Also included is a loop arrangement configured to mirror the current from the current mirror in the additional pair of field effect transistors (refer, e.g., to discussion of loops around M5 and M14 in connection with above description of FIG. 15).

The variable resistances and variable capacitances can be achieved in a variety of ways; in a non-limiting example, as noted, the variable resistances are realized as fixed resistors coupled to metal oxide semiconductor field effect transistors configured to operate in triode mode, and the variable capacitances are realized as a hard-wired fixed capacitor (e.g., C4,0; C3,0; C2,0; and C1,0/2) and one or more switched fixed capacitors (1 through m) in parallel thereto. A controller 1212 can be provided and can be operatively configured to provide band switching (for example, by switching the switched fixed capacitors) and to provide fine tuning (for example, by applying signals to the gates of the pairs of metal oxide semiconductor field effect transistors configured to operate in triode mode).

As noted, the filter can be a Papoulis filter or other all-poles filter.

As seen in FIGS. 13-15, in some cases, the linearized operational transconductance amplifier stages each comprise a first field effect transistor M3 interconnected between a supply voltage VDD and a current mirror and having a gate, a drain, and a source; a pair of variable resistances (each member of the pair formed by the four R/4 resistors) coupled to the supply voltage VDD; an additional pair of resistors Rx; and second and third field effect transistors M1 and M3 interconnected between the pair of variable resistances and the current mirror and each having a gate, a drain, and a source. The gates of the second and third field effect transistors are coupled to the gate of the first field effect transistor through the additional pair of resistors. The gates of the second and third field effect transistors comprise the corresponding pair of differential input terminals; the drains of the second and third field effect transistors are coupled to the corresponding pair of differential output terminals through the unity gain buffer with feedback, and the first field effect transistor having a device width at least twice a device width of the second and third field effect transistors (e.g., N≧2 as in FIG. 13).

Furthermore, given the discussion thus far, it will be appreciated that, in general terms, an exemplary filter, according to another aspect of the invention, includes N greater than unity gain amplifiers (e.g., 1602, 1604, 1606, 1608), N being at least two. Each of the greater than unity gain amplifiers has a pair of differential input terminals and a pair of differential output terminals. A first pair of variable resistances (e.g., R4 plus FET with VDAC on gate) couple the negative differential output terminal of the last greater than unity gain amplifier (e.g., 1608) to the positive differential input terminal of the first greater than unity gain amplifiers (e.g., 1602) and vice versa. The differential output terminals of the greater than unity gain amplifiers are coupled to the differential input terminals of their downstream neighbors through N−1 pairs of variable resistances in a manner similar to the filter, and the differential input terminals of each greater than unity gain amplifier, other than the last one, is coupled to the differential output terminals of its downstream neighbor, through variable capacitances in a manner similar to the filter. A variable capacitance couples the differential input terminals of the last greater than unity gain amplifiers to each other, capacitances in a manner similar to the filter. The N greater than unity gain amplifiers each in turn comprise a linearized operational transconductance amplifier stage coupled to a corresponding pair of the differential input terminals; and a unity gain buffer with feedback interconnected between the linearized operational transconductance amplifier stage and a corresponding pair of the differential output terminals, as for the filter, except that the gain is greater than one (for example by adjusting the switched resistances shown in FIGS. 14 and 15).

Control of the filter can be achieved as described above.

Even further, given the discussion thus far, it will be appreciated that, in general terms, an exemplary circuit, according to another aspect of the invention, includes a filter as described and an oscillator as described. Note that in claims directed to the filter and oscillator, elements associated with the oscillator may be preceded by the modifier "oscillator" to avoid confusion. The circuit can also include a control arrangement configured to compare the frequency of oscillation of the oscillator to a reference, and exert common control over the variable capacitances and resistances of the filter and oscillator, so as to match the frequency of oscillation of the oscillator to the reference and control bandwidth of the filter. The control arrangement is preferably operatively configured to switch the switched fixed capacitors to provide band switching and to apply signals to the gates of the pairs of metal oxide semiconductor field effect transistors configured to operate in triode mode to provide fine tuning.

As shown in FIG. 17, the filter and the oscillator are preferably realized on adjacent portions of an integrated circuit chip and are dimensionally identical within process limits of the process used to manufacture the integrated circuit chip.

In a preferred approach, in the linearized operational transconductance amplifier stages, the pairs of variable resistances (e.g., four switched resistors R/4) are adjusted to provide unity gain for the unity gain amplifiers and greater than unity gain for the greater than unity gain amplifiers.

In a non-limiting example, the control arrangement comprises a time-to-digital converter 1873 coupled to the oscillator to sense the frequency of oscillation of the oscillator, a digital phase-locked loop 1875 coupled to the time-to-digital converter and configured to compare the reference to the frequency of oscillation of the oscillator sensed by the time-to-digital converter, and a controller 1212 coupled to the digital phase-locked loop and operatively configured to exert the common control in response to the comparison by the digital phase-locked loop.

Integrated circuit chips in accordance with one or more embodiments of the invention can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, such as, by way of example and not limitation, a communications circuit or the like.

Figure 23:
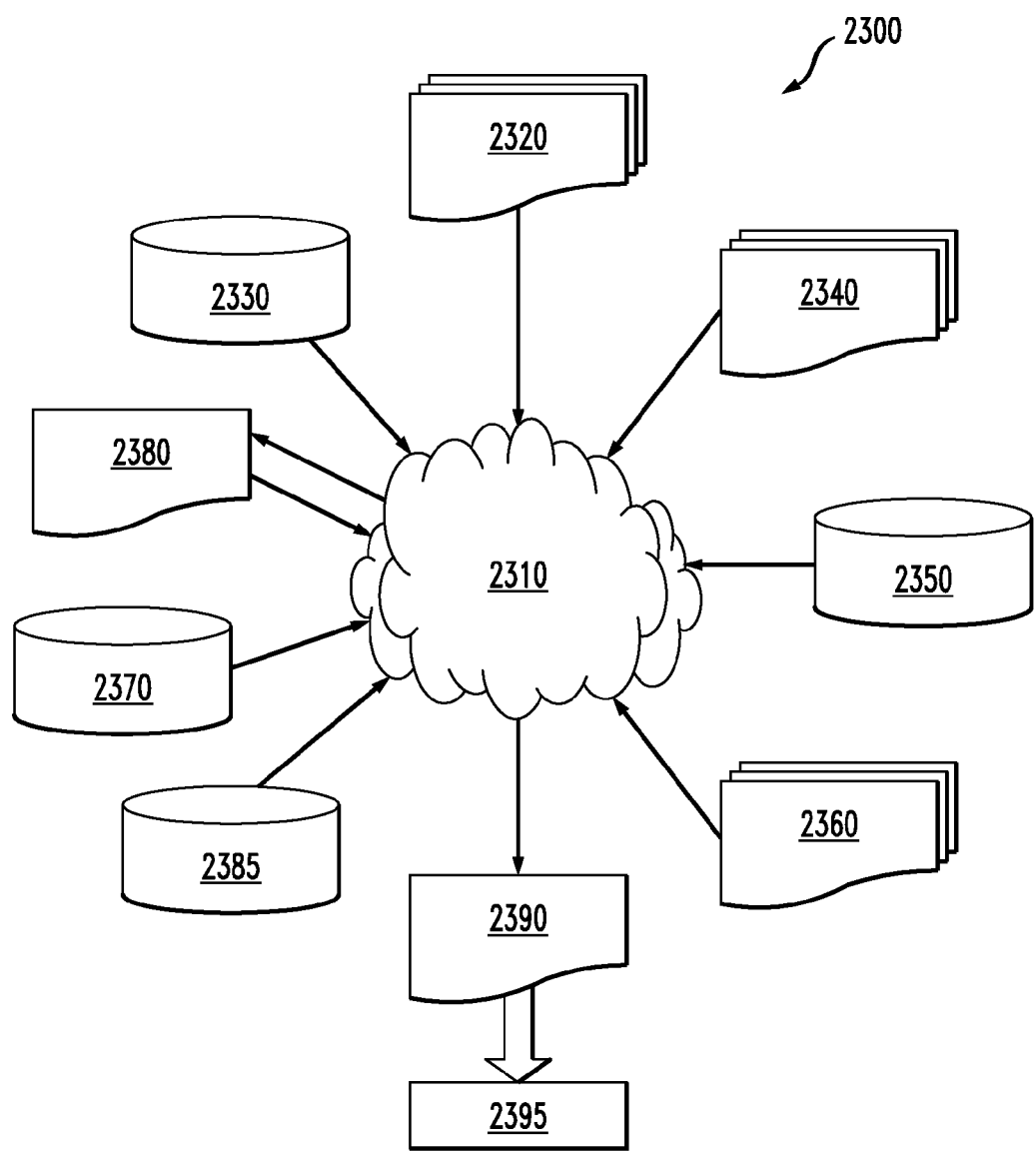
FIG. 23 is a flow diagram of a design process used in semiconductor design, manufacture, and/or test.

FIG. 23 shows a block diagram of an exemplary design flow 2300 used for example, in semiconductor IC logic design, simulation, test, layout, and manufacture. Design flow 2300 includes processes, machines and/or mechanisms for processing design structures or devices to generate logically or otherwise functionally equivalent representations of the design structures and/or devices described above and shown in FIGS. 1, 2, and 12-18. The design structures processed and/or generated by design flow 2300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium(e.g. a machine for programming a programmable gate array). Design flow 2300 may vary depending on the type of representation being designed. For example, a design flow 2300 for building an application specific IC (ASIC) may differ from a design flow 2300 for designing a standard component or from a design flow 2300 for instantiating the design into a programmable array, for example a programmable gate array (PGA) or a field programmable gate array (FPGA) offered by Altera® Inc. or Xilinx® Inc. FIG. 23 illustrates multiple such design structures including an input design structure 2320 that is preferably processed by a design process 2310. Design structure 2320 may be a logical simulation design structure generated and processed by design process 2310 to produce a logically equivalent functional representation of a hardware device. Design structure 2320 may also or alternatively comprise data and/or program instructions that when processed by design process 2310, generate a functional representation of the physical structure of a hardware device. Whether representing functional and/or structural design features, design structure 2320 may be generated using electronic computer-aided design (ECAD) such as implemented by a core developer/designer. When encoded on a machine-readable data transmission, gate array, or storage medium, design structure 2320 may be accessed and processed by one or more hardware and/or software modules within design process 2310 to simulate or otherwise functionally represent an electronic component, circuit, electronic or logic module, apparatus, device, or system such as those shown in FIGS. 1, 2, and 12-18. As such, design structure 2320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language(HDL) design entities or other data structures conforming to and/or compatible with lower-level HDL design languages such as Verilog and VHDL, and/or higher level design languages such as C or C++. Design process 2310 preferably employs and incorporates hardware and/or software modules for synthesizing, translating, or otherwise processing a design/simulation functional equivalent of the components, circuits, devices, or logic structures shown in FIGS. 1, 2, and 12-18 to generate a netlist 2380 which may contain design structures such as design structure 2320. Netlist 2380 may comprise, for example, compiled or otherwise processed data structures representing a list of wires, discrete components, logic gates, control circuits, I/O devices, models, etc. that describes the connections to other elements and circuits in an integrated circuit design. Netlist 2380 may be synthesized using an iterative process in which netlist 2380 is resynthesized one or more times depending on design specifications and parameters for the device. As with other design structure types described herein, netlist 2380 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means. Design process 2310 may include hardware and software modules for processing a variety of input data structure types including netlist 2380. Such data structure types may reside, for example, within library elements 2330 and include a set of commonly used elements, circuits, and devices, including models, layouts, and symbolic representations, for a given manufacturing technology(e.g., different technology nodes, 32 nm, 45 nm, 90 nm, etc.). The data structure types may further include design specifications 2340, characterization data 2350, verification data 2360, design rules 2370, and test data files 2385 which may include input test patterns, output test results, and other testing information. Design process 2310 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 2310 without deviating from the scope and spirit of the invention. Design process 2310 may also include modules for performing standard circuit design processes such as timing analysis, verification, design rule checking, place and route operations, etc. Design process 2310 employs and incorporates logic and physical design tools such as HDL compilers and simulation model build tools to process design structure 2320 together with some or all of the depicted supporting data structures along with any additional mechanical design or data(if applicable), to generate a second design structure 2390. Design structure 2390 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 2320, design structure 2390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1, 2, and 12-18. In one embodiment, design structure 2390 may comprise a compiled, executable HDL simulation model that functionally simulates the devices shown in FIGS. 1, 2, and 12-18. Design structure 2390 may also employ a data format used for the exchange of layout data of integrated circuits and/or symbolic data format (e.g. information stored in a GDSII (GDS2), GL1, OASIS, map files, or any other suitable format for storing such design data structures). Design structure 2390 may comprise information such as, for example, symbolic data, map files, test files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 2, and 12-18. Design structure 2390 may then proceed to a stage 2395 where, for example, design structure 2390: proceeds to tape-out, is released to manufacturing, is released to a mask house, is sent to another design house, is sent back to the customer, etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A filter comprising:
   N unity gain amplifiers, N being at least two, each of said N unity gain amplifiers having a pair of differential input terminals and a pair of differential output terminals, said pair of differential output terminals of a last one of said N unity gain amplifiers comprising filter differential output terminals;
   a pair of filter differential input terminals;
   a first pair of variable resistances coupling said pair of filter differential input terminals to said pair of differential input terminals of a first one of said N unity gain amplifiers;
   N−1 pairs of variable resistances coupling said pairs of differential output terminals of each of said N unity gain amplifiers, other than said last one of said N unity gain amplifiers, to said pairs of differential input terminals of its downstream neighbor;
   N−1 pairs of variable capacitances coupling said pairs of differential input terminals of each of said N unity gain amplifiers, other than said last one of said N unity gain amplifiers, to said pairs of differential output terminals of its downstream neighbor; and a variable capacitance coupling said pair of differential input terminals of said last one of said N unity gain amplifiers to each other;

wherein said N unity gain amplifiers each in turn comprise:
a linearized operational transconductance amplifier stage coupled to a corresponding pair of said differential input terminals; and
a unity gain buffer with feedback interconnected between said linearized operational transconductance amplifier stage and a corresponding pair of said differential output terminals.

2. The filter of claim 1, further comprising a controller, wherein:
said first pair of variable resistances and said N−1 pairs of variable resistances each comprise pairs of fixed resistors coupled to pairs of metal oxide semiconductor field effect transistors configured to operate in triode mode, each of said metal oxide semiconductor field effect transistors having a gate;
said N−1 variable capacitances and said variable capacitance coupling said pair of differential input terminals of said last one of said N unity gain amplifiers to each other each comprise a hard-wired fixed capacitor and at least one switched fixed capacitor in parallel thereto; and
said controller is operatively configured to switch said switched fixed capacitors to provide band switching and to apply signals to said gates of said pairs of metal oxide semiconductor field effect transistors configured to operate in triode mode to provide fine tuning.

3. The filter of claim 2, wherein said filter comprises a Papoulis filter.

4. The filter of claim 3, wherein said linearized operational transconductance amplifier stages each comprise:
a first field effect transistor interconnected between a supply voltage and a current mirror and having a gate, a drain, and a source;
a pair of variable resistances coupled to said supply voltage;
an additional pair of resistors; and
second and third field effect transistors interconnected between said pair of variable resistances and said current mirror and each having a gate, a drain, and a source, said gates of said second and third field effect transistors being coupled to said gate of said first field effect transistor through said additional pair of resistors, said gates of said second and third field effect transistors comprising said corresponding pair of differential input terminals; said drains of said second and third field effect transistors being coupled to said corresponding pair of differential output terminals through said unity gain buffer with feedback, said first field effect transistor having a device width at least twice a device width of said second and third field effect transistors.

5. The filter of claim 4, wherein said unity gain buffer with feedback comprises:
an additional pair of field effect transistors having gates coupled to said drains of said second and third field effect transistors and sources coupled to said corresponding pair of differential output terminals; and
a loop arrangement configured to mirror said current from said current mirror in said additional pair of field effect transistors.

6. A circuit comprising:
a filter, said filter in turn comprising:

N unity gain amplifiers, N being at least two, each of said N unity gain amplifiers having a pair of differential input terminals and a pair of differential output terminals, said pair of differential output terminals of a last one of said N unity gain amplifiers comprising filter differential output terminals;
a pair of filter differential input terminals;
a first pair of variable resistances coupling said pair of filter differential input terminals to said pair of differential input terminals of a first one of said N unity gain amplifiers;
N−1 pairs of variable resistances coupling said pairs of differential output terminals of each of said N unity gain amplifiers, other than said last one of said N unity gain amplifiers, to said pairs of differential input terminals of its downstream neighbor;
N−1 pairs of variable capacitances coupling said pairs of differential input terminals of each of said N unity gain amplifiers, other than said last one of said N unity gain amplifiers, to said pairs of differential output terminals of its downstream neighbor; and
a variable capacitance coupling said pair of differential input terminals of said last one of said N unity gain amplifiers to each other;
wherein said N unity gain amplifiers each in turn comprise:
a linearized operational transconductance amplifier stage coupled to a corresponding pair of said differential input terminals; and
a unity gain buffer with feedback interconnected between said linearized operational transconductance amplifier stage and a corresponding pair of said differential output terminals;
an oscillator, said oscillator in turn comprising:
N greater than unity gain amplifiers, N being at least two, each of said N greater than unity gain amplifiers having a pair of differential input terminals and a pair of differential output terminals;
a first pair of oscillator variable resistances coupling:
a negative one of said pair of differential output terminals of a last one of said N greater than unity gain amplifiers to a positive one of said pair of differential input terminals of a first one of said N greater than unity gain amplifiers, and
a positive one of said pair of differential output terminals of said last one of said N greater than unity gain amplifiers to a negative one of said pair of differential input terminals of said first one of said N greater than unity gain amplifiers;
N−1 pairs of oscillator variable resistances coupling said pairs of differential output terminals of each of said N greater than unity gain amplifiers, other than said last one of said N greater than unity gain amplifiers, to said pairs of differential input terminals of its downstream neighbor;
N−1 pairs of oscillator variable capacitances coupling said pairs of differential input terminals of each of said N greater than unity gain amplifiers, other than said last one of said N greater than unity gain amplifiers, to said pairs of differential output terminals of its downstream neighbor; and
an oscillator variable capacitance coupling said pair of differential input terminals of said last one of said N greater than unity gain amplifiers to each other;
wherein said N greater than unity gain amplifiers each in turn comprise:

a linearized operational transconductance amplifier stage coupled to a corresponding pair of said differential input terminals; and a unity gain buffer with feedback interconnected between said linearized operational transconductance amplifier stage and a corresponding pair of said differential output terminals; and a control arrangement configured to:

compare a frequency of oscillation of said oscillator to a reference; and exert common control over said first pair of variable resistances, said N−1 pairs of variable resistances, said N−1 pairs of variable capacitances, said variable capacitance coupling said pair of differential input terminals of said last one of said N unity gain amplifiers to each other, said first pair of oscillator variable resistances, said N−1 pairs of oscillator variable resistances, said N−1 pairs of oscillator variable capacitances, and said oscillator variable capacitance coupling said pair of differential input terminals of said last one of said N greater than unity gain amplifiers to each other, so as to match said frequency of oscillation of said oscillator to said reference and control bandwidth of said filter.

7. The circuit of claim 6, wherein:

said first pair of variable resistances and said N−1 pairs of variable resistances each comprise pairs of fixed resistors coupled to pairs of metal oxide semiconductor field effect transistors configured to operate in triode mode, each of said metal oxide semiconductor field effect transistors having a gate;

said N−1 pairs of variable capacitances and said variable capacitance coupling said pair of differential input terminals of said last one of said N unity gain amplifiers to each other each comprise a hard-wired fixed capacitor and at least one switched fixed capacitor in parallel thereto;

said first pair of oscillator variable resistances and said N−1 pairs of oscillator variable resistances each comprise pairs of fixed resistors coupled to pairs of metal oxide semiconductor field effect transistors configured to operate in triode mode, each of said metal oxide semiconductor field effect transistors having a gate;

said N−1 pairs of oscillator variable capacitances and said oscillator variable capacitance coupling said pair of differential input terminals of said last one of said N greater than unity gain amplifiers to each other each comprise a hard-wired fixed capacitor and at least one switched fixed capacitor in parallel thereto; and said control arrangement is operatively configured to switch said switched fixed capacitors to provide band switching and to apply signals to said gates of said pairs of metal oxide semiconductor field effect transistors configured to operate in triode mode to provide fine tuning.

8. The circuit of claim 7, wherein said filter comprises a Papoulis filter.

9. The circuit of claim 7, wherein said linearized operational transconductance amplifier stages each comprise:

a first field effect transistor interconnected between a supply voltage and a current mirror and having a gate, a drain, and a source;

a pair of variable resistances coupled to said supply voltage;

an additional pair of resistors; and second and third field effect transistors interconnected between said pair of variable resistances and said current mirror and each having a gate, a drain, and a source, said gates of said second and third field effect transistors being coupled to said gate of said first field effect transistor through said additional pair of resistors, said gates of said second and third field effect transistors comprising said corresponding pair of differential input terminals; said drains of said second and third field effect transistors being coupled to said corresponding pair of differential output terminals through said unity gain buffer with feedback, said first field effect transistor having a device width at least twice a device width of said second and third field effect transistors.

10. The circuit of claim 9, wherein said unity gain buffer with feedback comprises:

an additional pair of field effect transistors having gates coupled to said drains of said second and third field effect transistors and sources coupled to said corresponding pair of differential output terminals; and a loop arrangement configured to mirror said current from said current mirror in said additional pair of field effect transistors.

11. The circuit of claim 9, wherein said filter and said oscillator are realized on adjacent portions of an integrated circuit chip and are dimensionally identical within process limits of said integrated circuit chip.

12. The circuit of claim 11, wherein, in said linearized operational transconductance amplifier stages, said pairs of variable resistances are adjusted to provide unity gain for said unity gain amplifiers and greater than unity gain for said greater than unity gain amplifiers.

13. The circuit of claim 7, wherein said control arrangement comprises:

a time-to-digital converter coupled to said oscillator to sense said frequency of oscillation of said oscillator;

a digital phase-locked loop coupled to said time-to-digital converter and configured to compare said reference to said frequency of oscillation of said oscillator sensed by said time-to-digital converter; and a controller coupled to said digital phase-locked loop and operatively configured to exert said common control in response to said comparison by said digital phase-locked loop.

* * * * *